United States Patent
Kawamoto

(10) Patent No.: US 11,121,116 B2
(45) Date of Patent: Sep. 14, 2021

(54) MANUFACTURING METHOD OF POWER SEMICONDUCTOR DEVICE, POWER SEMICONDUCTOR DEVICE, AND POWER CONVERTER

(71) Applicant: Mitsubishi Electric Corporation, Tokyo (JP)

(72) Inventor: Keisuke Kawamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 3 days.

(21) Appl. No.: 16/672,126

(22) Filed: Nov. 1, 2019

(65) Prior Publication Data

US 2020/0235072 A1 Jul. 23, 2020

(30) Foreign Application Priority Data

Jan. 18, 2019 (JP) .............................. JP2019-006510

(51) Int. Cl.
*H01L 23/36* (2006.01)
*H01L 23/00* (2006.01)
(Continued)

(52) U.S. Cl.
CPC .............. *H01L 24/83* (2013.01); *H01L 24/29* (2013.01); *H01L 24/32* (2013.01); *H01L 24/75* (2013.01);
(Continued)

(58) Field of Classification Search
CPC ........... H01L 2224/75252; H01L 24/83; H01L 2224/29076; H01L 2924/20105; H01L 2224/83055; H01L 2224/32227; H01L 2924/3512; H01L 2224/29139; H01L 23/3675; H01L 2224/8383; H01L 24/27; H01L 2224/293; H01L 2224/2939; H01L 2224/73265; H01L 2224/29147; H01L 2224/83211; H01L 23/3735; H01L 2224/29017; H01L 2224/75347; H01L 2224/83815; H01L 24/75;
(Continued)

(56) References Cited

U.S. PATENT DOCUMENTS

| 9,159,654 B2 * | 10/2015 | Nogami | ................ H01L 23/482 |
| 2004/0084769 A1 * | 5/2004 | Sugaya | ............. H01L 23/49894 257/734 |
| 2012/0025366 A1 * | 2/2012 | Kanaya | ................. H01L 23/552 257/693 |

FOREIGN PATENT DOCUMENTS

| JP | H05283449 A | | 10/1993 | |
| JP | 2017076741 | * | 4/2017 | ... H01L 2224/73265 |

(Continued)

*Primary Examiner* — Matthew V Nguyen
(74) *Attorney, Agent, or Firm* — Studebaker & Brackett PC

(57) ABSTRACT

A power semiconductor element and a support member are stacked with an intermediate structure being interposed between the power semiconductor element and the support member. The intermediate structure includes a first metal paste layer and at least one first penetrating member. The first metal paste layer contains a plurality of first metal particles. The at least one first penetrating member penetrates the first metal paste layer. At least one first vibrator attached to the at least one first penetrating member penetrating the first metal paste layer is vibrated. The first metal paste layer is heated so that the plurality of first metal particles are sintered or fused.

18 Claims, 20 Drawing Sheets

(51) Int. Cl.
  *H02M 7/5387* (2007.01)
  *H02P 27/08* (2006.01)
  *H01L 23/367* (2006.01)

(52) U.S. Cl.
  CPC ..... *H02M 7/53871* (2013.01); *H01L 23/3675* (2013.01); *H01L 2224/29139* (2013.01); *H01L 2224/29144* (2013.01); *H01L 2224/29147* (2013.01); *H01L 2224/32225* (2013.01); *H01L 2224/75265* (2013.01); *H01L 2224/75266* (2013.01); *H01L 2224/75347* (2013.01); *H01L 2224/8383* (2013.01); *H01L 2224/8384* (2013.01); *H01L 2224/83207* (2013.01); *H01L 2924/20105* (2013.01); *H01L 2924/3512* (2013.01); *H02P 27/08* (2013.01)

(58) Field of Classification Search
  CPC ..... H01L 2224/32225; H01L 2224/279; H01L 24/45; H01L 2224/27312; H01L 24/29; H01L 2224/75266; H01L 2224/48; H01L 2224/29016; H01L 2224/29339; H01L 2224/29347; H01L 2224/83101; H01L 2224/29294; H01L 2224/83207; H01L 2224/8384; H01L 2224/7525; H01L 2224/75251; H01L 2224/75343; H01L 2224/48227; H01L 2924/19107; H01L 2224/27334; H01L 2224/29144; H01L 2224/832; H01L 2224/75265; H01L 24/32; H01L 2924/00014; H01L 2224/27332; H01L 2924/014; H01L 2924/00012; H02M 7/003; H02M 7/53871; H02P 27/08

See application file for complete search history.

(56) References Cited

FOREIGN PATENT DOCUMENTS

| JP | 2018026417 A | 2/2018 | | |
|---|---|---|---|---|
| WO | WO-9813862 A1 | * | 4/1998 | ......... H01L 21/3043 |
| WO | WO-2019013589 A1 | * | 1/2019 | ............. H01L 23/00 |

* cited by examiner

F I G. 3
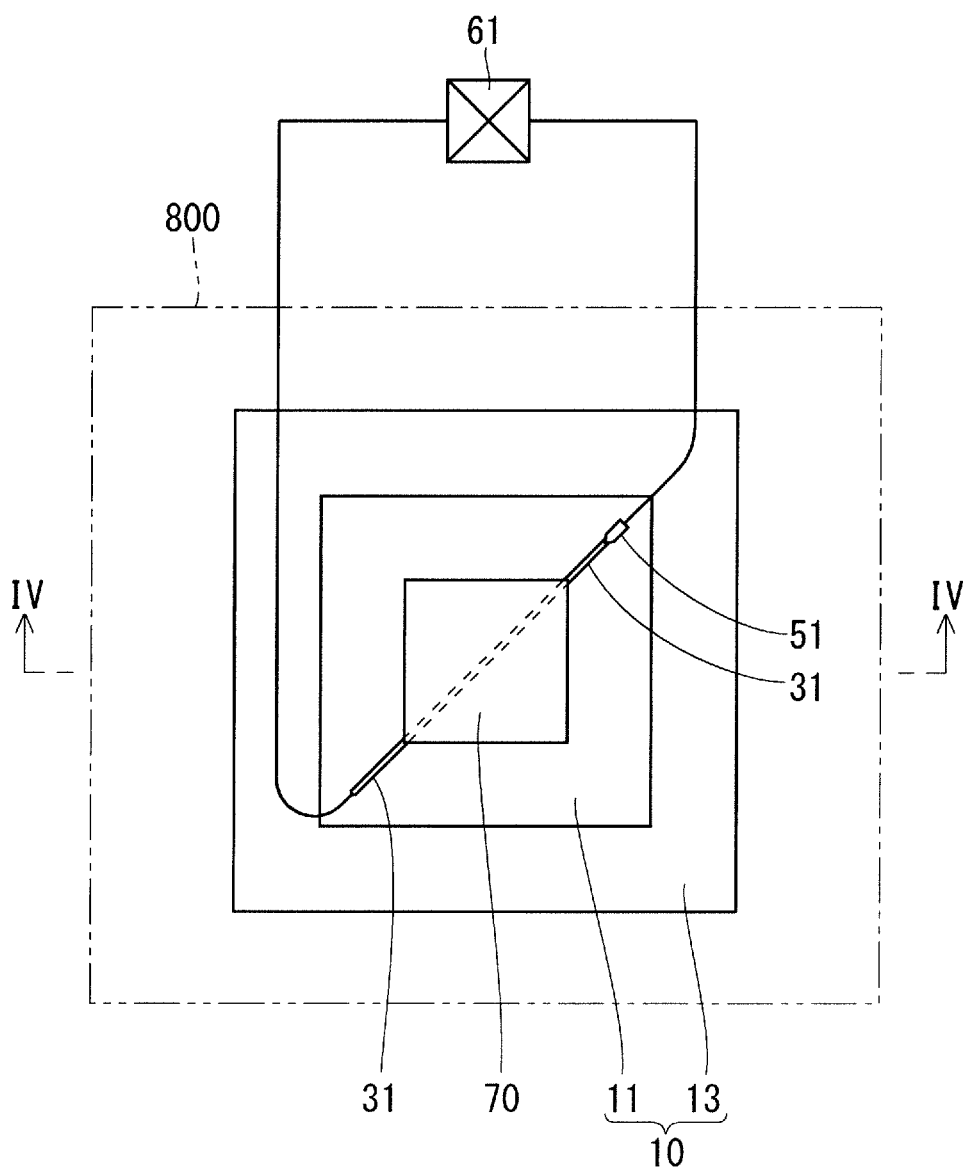

F I G. 4
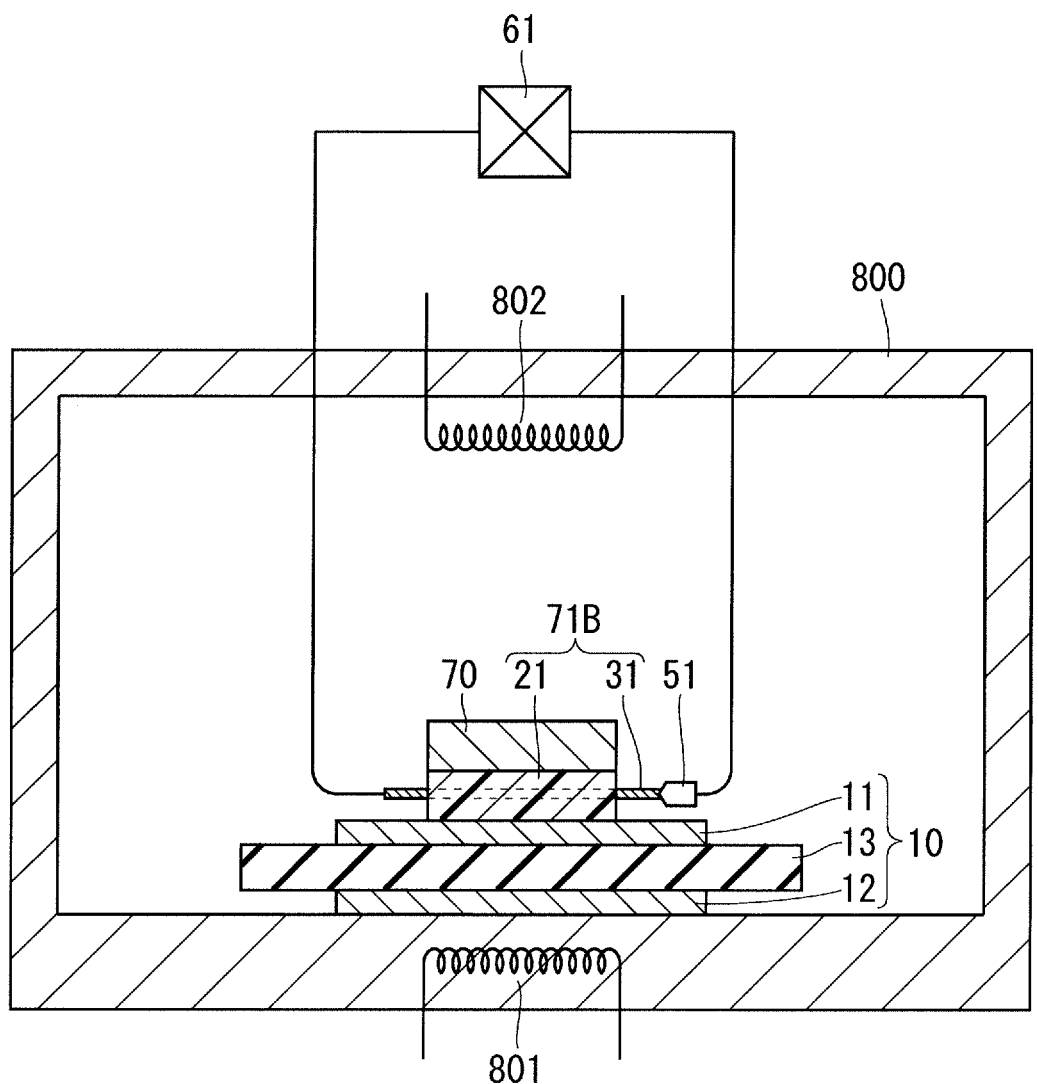

F I G. 5
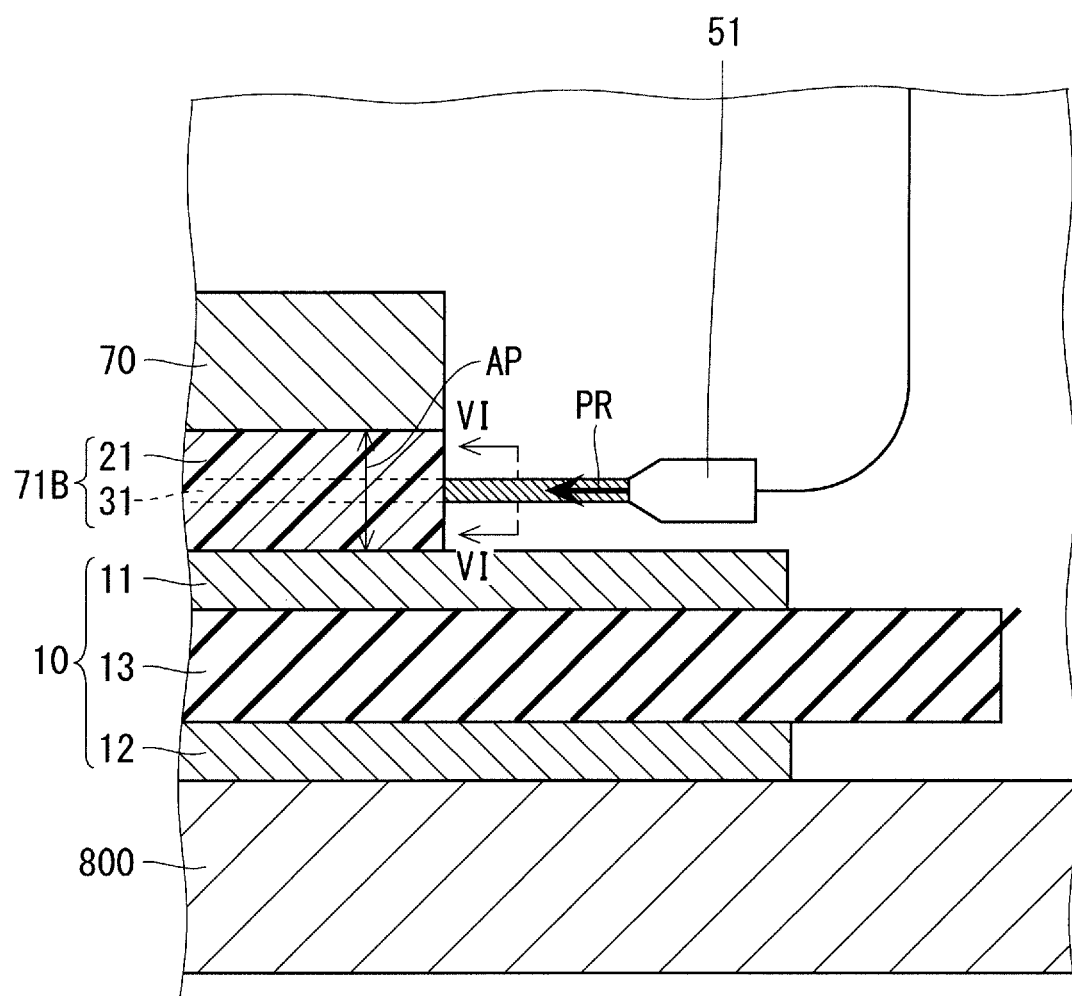

31

31a

31b

F I G 1 3
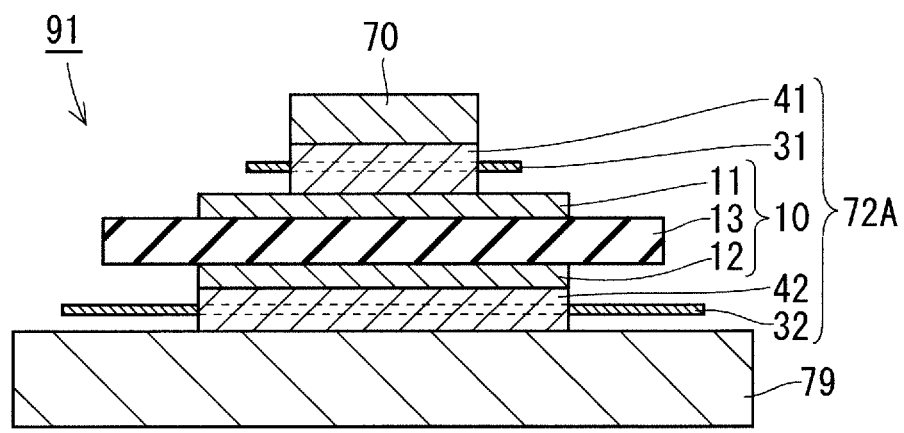

MANUFACTURING METHOD OF POWER SEMICONDUCTOR DEVICE, POWER SEMICONDUCTOR DEVICE, AND POWER CONVERTER

BACKGROUND OF THE INVENTION

Field of the Invention

The present invention relates to a manufacturing method of a power semiconductor device, a power semiconductor device, and a power converter.

Description of the Background Art

Japanese Patent Application Laid-Open No. 5-283449 (1993) discloses a soldering method for a bare chip. According to this method, first, a bare chip and a heat spreader are soldered together in a reflow process. Next, an inspection process is performed. Next, an air void removal process is performed. Specifically, the solder is melted again by applying slight vibration on a hot plate to which an ultrasonic vibrator is attached. Japanese Patent Application Laid-Open No. 5-283449 (1993) argues that heat dissipation performance for heat generated by a bare chip is enhanced by removing air voids of solder in the air void removal process.

According to Japanese Patent Application Laid-Open No. 2018-026417, the following problem is pointed out. Specifically, because a semiconductor chip made of SiC has high rigidity as compared to a semiconductor chip made of Si, significant thermal strain occurs at a solder joining portion and thereby deterioration occurs during high temperature operation. Further, in view of this problem, Japanese Patent Application Laid-Open No. 2018-026417 discloses substitution of a metal sintered material of silver (Ag) etc. for solder as a material for a joining portion. In a process of forming this joining portion, an organic solvent and a paste-like joining material containing dispersed Ag particles are printed on a substrate. Next, the organic solvent is volatilized. Next, a semiconductor chip is mounted on the joining material. Next, the semiconductor chip is heated while being pressurized in a direction of the substrate. In this manner, the joining material is sintered. Japanese Patent Application Laid-Open No. 2018-026417 argues that the use of an Ag sintered material, which is less liable to be cracked as compared to solder, can reduce deterioration in heat dissipation performance due to cracks.

In recent years, there has been a demand for further increase in power density and operable temperature of a power semiconductor device. Particularly when a wide-bandgap semiconductor, such as silicon carbide (SiC) and gallium nitride (GaN), is used as a semiconductor material, there is a higher demand of such a kind. Along with the demand, enhancement in heat dissipation performance of dissipating heat from a semiconductor chip (semiconductor element) in a power semiconductor device has also been required. In reference to such a requirement, high heat conductivity is required for a joining layer for joining a semiconductor element.

According to the technology of Japanese Patent Application Laid-Open No. 5-283449 (1993), ultrasonic waves for removing air voids in a solder layer as a joining layer are applied through a heat spreader (heat dissipation member). Thus, because ultrasonic wave radiation for the solder layer may not be easily performed in an effective manner, a joining layer may not be sufficiently densified. Consequently, heat conductivity of a joining layer may be insufficient. As a result, heat dissipation performance of a power semiconductor device may be insufficient.

According to the technology of Japanese Patent Application Laid-Open No. 2018-026417, a joining layer formed by sintering of a joining material can be more densified as higher pressure is applied to a semiconductor chip when a joining material containing Ag particles is heated. However, application of a high pressure may damage a semiconductor element. Thus, the joining layer may not be sufficiently densified. Consequently, heat conductivity of the joining layer may be insufficient. As a result, heat dissipation performance of a power semiconductor device may be insufficient.

SUMMARY

The present invention is made in order to solve the problems as described above, and has an object to provide a manufacturing method of a power semiconductor device, a power semiconductor device, and a power converter, with which heat dissipation performance of a power semiconductor device can be enhanced.

A manufacturing method of a power semiconductor device according to the present invention includes the following steps. A power semiconductor element and a support member are stacked with an intermediate structure being interposed between the power semiconductor element and the support member. The intermediate structure includes a first metal paste layer and at least one first penetrating member. The first metal paste layer contains a plurality of first metal particles. The at least one first penetrating member penetrates the first metal paste layer. At least one first vibrator attached to the at least one first penetrating member penetrating the first metal paste layer is vibrated. The first metal paste layer is heated so that the plurality of first metal particles are sintered or fused.

According to the present invention, at least one first vibrator attached to at least one first penetrating member penetrating a first metal paste layer is vibrated. In this manner, a first metal paste layer is vibrated. With this configuration, quality of a joining layer obtained from the first metal paste can be enhanced. Consequently, heat conduction from a power semiconductor element through the joining layer is accelerated. Consequently, heat dissipation performance of the power semiconductor device can be enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view schematically illustrating one process of a manufacturing method of the power semiconductor device according to the first embodiment of the present invention.

FIG. 4 is a schematic cross-sectional view taken along the line IV-IV of FIG. 3.

FIG. 5 is a partially enlarged view of FIG. 4.

FIG. 13 is a schematic cross-sectional view taken along the line XIII-XIII of FIG. 12.

DESCRIPTION OF THE PREFERRED EMBODIMENTS

Figure 1:
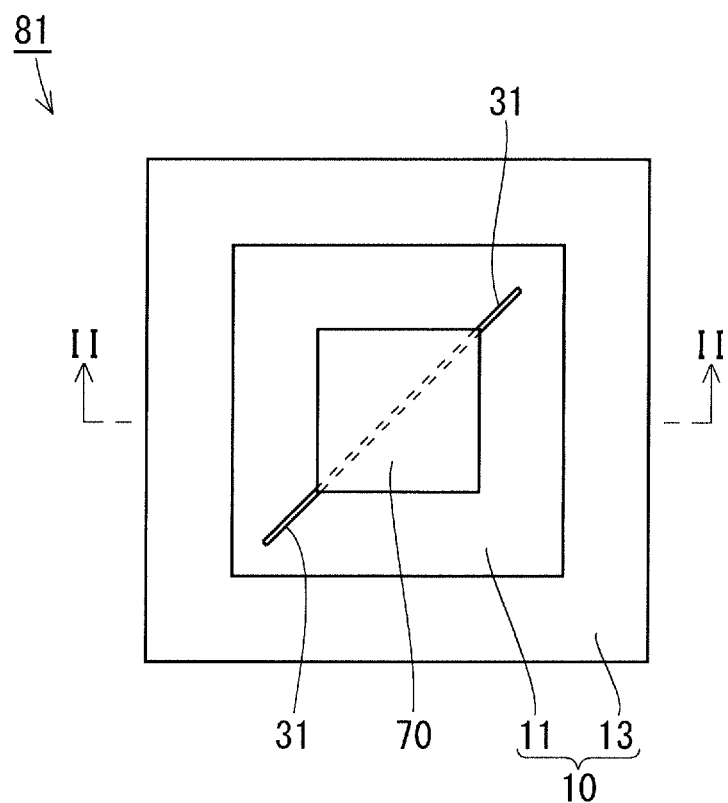
FIG. 1 is a plan view schematically illustrating a configuration of a power semiconductor device according to a first embodiment of the present invention.

Embodiments of the present invention will be described below with reference to the drawings. Note that, in the drawings below, the same or equivalent parts are denoted by the same reference signs to omit repeated description thereof.

First Embodiment (Configuration)

Figure 2:
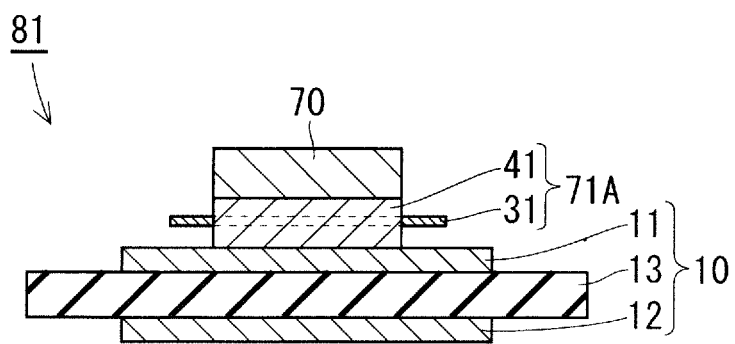
FIG. 2 is a schematic cross-sectional view taken along the line II-II of FIG. 1.

FIG. 1 is a plan view schematically illustrating a configuration of a power module 81 (power semiconductor device) according to a first embodiment of the present invention. FIG. 2 is a schematic cross-sectional view taken along the line II-II of FIG. 1.

The power module 81 includes a circuit substrate 10 (support member of the first embodiment), an intermediate structure 71A, and a power semiconductor chip 70 (power semiconductor element). The intermediate structure 71A is provided on the circuit substrate 10. The intermediate structure 71A includes a joining layer 41 and a penetrating member 31 (first penetrating member). The joining layer 41 contains metal. The penetrating member 31 penetrates the joining layer 41. The power semiconductor chip 70 is provided on the intermediate structure 71A. The power semiconductor chip 70 is joined to the circuit substrate 10 by the intermediate structure 71A.

For example, the power semiconductor chip 70 includes, as its function, a metal oxide semiconductor field effect transistor (MOSFET), an insulated gate bipolar transistor (IGBT), a Schottky barrier diode (SBD), a pn junction diode, or a pin diode, or a combination consisting of two or more of the elements mentioned above. The power semiconductor chip 70 may include a semiconductor layer made of a wide-bandgap semiconductor, such as SiC and GaN.

In this embodiment, the joining layer 41 is made of a sintered material of metal particles. Specifically, the joining layer 41 is made of a sintered material of Ag particles. A joining layer made of a sintered material has excellent strength and heat conductivity as compared to a joining layer made of solder (i.e., a joining layer formed by solidification of fused metal), and is particularly suitable when a wide-bandgap semiconductor is used for the power semiconductor chip 70.

The penetrating member 31 may include first and second end portions (a left end portion and a right end portion in FIG. 2) projecting from the joining layer 41. The penetrating member 31 is made of metal. For example, the penetrating member 31 is made of gold (Au), silver (Ag), or copper (Cu). The penetrating member 31 may be a non-sintered material. For example, the penetrating member 31 is a cast product. Alternatively, the penetrating member 31 may be a sintered material. In such a case, it is preferable that sintered density of the penetrating member 31 be higher than sintered density of the joining layer 41. A material composition of the penetrating member 31 may be different from a material composition of the joining layer 41.

The circuit substrate 10 includes an insulation plate 13, a metal circuit pattern 11, and a metal circuit pattern 12. The joining layer 41 is joined to the metal circuit pattern 11. The insulation plate 13 is made of ceramic or resin. A metal wire (not shown) may be connected to the metal circuit pattern 11 or the metal circuit pattern 12. For example, the metal wire is made of aluminum (Al) or Cu. The power semiconductor chip 70 above the circuit substrate 10 may be protected by a sealing member (not shown). For example, the sealing member includes a case, and a gel accommodated in the case.

(Manufacturing Method)

Figure 6:
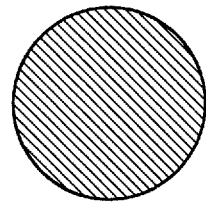
FIG. 6 is a schematic cross-sectional view taken along the line VI-VI of FIG. 5.

FIG. 3 is a plan view schematically illustrating one process of a manufacturing method of the power module 81 according to the first embodiment. FIG. 4 is a schematic cross-sectional view taken along the line IV-IV of FIG. 3. FIG. 5 is a partially enlarged view of FIG. 4. FIG. 6 is a schematic cross-sectional view taken along the line VI-VI of FIG. 5.

The power semiconductor chip 70 and the circuit substrate 10 are stacked, with an intermediate structure 71B (FIG. 4) being interposed between the power semiconductor chip 70 and the circuit substrate 10. The intermediate structure 71B includes a metal paste layer 21 (first metal paste layer) and a penetrating member 31 (first penetrating member). The penetrating member 31 penetrates the metal paste layer 21. The penetrating member 31 may include first and second end portions (a left end portion and a right end portion in FIG. 4) projecting from the metal paste layer 21.

The metal paste layer 21 contains a plurality of metal particles (plurality of first metal particles). In this embodiment, the metal paste layer 21 contains a plurality of Ag particles. The plurality of Ag particles are dispersed in an organic solvent in the metal paste layer 21. The metal paste layer 21 may contain resin. For example, the thickness of the metal paste layer 21 is approximately 500 μm.

When the power semiconductor chip 70 and the circuit substrate 10 are stacked, it is preferable that the penetrating member 31 be disposed along a diagonal direction of the power semiconductor chip 70. After the power semiconductor chip 70 and the circuit substrate 10 are stacked with the metal paste layer 21 being interposed between the power semiconductor chip 70 and the circuit substrate 10, the penetrating member 31 may be inserted into the metal paste layer 21. Alternatively, the penetrating member 31 may be disposed on one of the power semiconductor chip 70 and the circuit substrate 10. Next, the metal paste layer 21 may be applied on the first penetrating member. Next, the power semiconductor chip 70 and the circuit substrate 10 may be stacked, with the metal paste layer 21 and the penetrating member 31 being interposed between the power semiconductor chip 70 and the circuit substrate 10. For example, application of the metal paste layer 21 is performed by using a syringe.

Next, the stacked material is transferred into a heating furnace 800. Next, by using a heater 801 and a heater 802 provided in the heating furnace 800, the metal paste layer 21 is heated. A heating process includes an initial process, and a high-temperature process that follows the initial process. In the initial process, the metal paste layer 21 is heated within a temperature range of a first temperature or below. The first temperature is such a low temperature as not to allow remarkable progression of sintering reaction of Ag particles in the metal paste layer 21. In the high-temperature process, the metal paste layer 21 is heated up to a second temperature, which is higher than the first temperature. The second temperature is such a high temperature as to allow effective progression of sintering reaction of Ag particles in the metal paste layer 21, and is a temperature lower than a melting point of the Ag particles.

In the initial process of the heating process, the organic solvent in the metal paste layer 21 is evaporated prior to the sintering reaction. As a result, voids are formed. At this time, if a pressure of pressing both the power semiconductor chip 70 and the circuit substrate 10 is applied from the outside through the intermediate structure 718, removal of the voids from the metal paste layer 21 is accelerated. However, the power semiconductor chip 70 may be damaged due to such a pressure. In view of this, in this embodiment, heating of the metal paste layer 21 is performed without pressure application from the outside.

After voids are formed as described above, a vibrator 51 (first vibrator), which is attached to the penetrating member 31 penetrating the metal paste layer 21, is vibrated. With this configuration, the penetrating member 31 is vibrated. As a result, voids are moved out of the metal paste layer 21 in a vibration propagation direction PR (FIG. 5), i.e., a direction away from the penetrating member 31. Consequently, an amount of voids in the metal paste layer 21 is reduced.

Note that the timing of starting vibration may be before voids are formed. Further, the timing of attaching the vibrator 51 to the penetrating member 31 may be either before or after the penetrating member 31 is caused to penetrate the metal paste layer 21. The vibrator 51 is an element that is vibrated when an electric signal is applied. For example, the vibrator 51 is a piezoelectric element. Specifically, an electric signal generated by a signal generator 61 is applied to the vibrator 51. This electric signal may be applied by using a current path that passes through the penetrating member 31. Specifically, when a vibrator 51 including two terminals for application of an electric signal is used, one of the terminals may be connected to the signal generator 61 with an electrical wire, and the other terminal may be connected to the signal generator 61 with the penetrating member 31 and an electrical wire.

In this embodiment, a vibration direction AP (FIG. 5) of the penetrating member 31 is a thickness direction (vertical direction in FIG. 4). It is preferable that the vibrator 51 be vibrated such that amplitude of the penetrating member 31 is equal to or less than the thickness of the metal paste layer 21. Note that the vibration direction is not limited to the thickness direction, and may be an in-plane direction (direction perpendicular to the drawing sheet of FIG. 4).

It is preferable that stacking of the power semiconductor chip 70 and the circuit substrate 10 interposing the intermediate structure 71B be performed such that each of one side (upper side in FIG. 4) and another side (lower side in FIG. 4) of the penetrating member 31 in a stacking direction (vertical direction in FIG. 4, i.e., thickness direction) faces the metal paste layer 21. It is more preferable that the penetrating member 31 be disposed in the middle of the metal paste layer 21 in the stacking direction.

It is preferable that vibration of the vibrator 51 be stopped before the high-temperature process (process of heating the metal paste layer 21 up to the second temperature higher than the first temperature) of the heating process. It is preferable that the first temperature be lower than a sintering temperature of the metal paste layer 21. Although the sintering temperature depends on a material of the metal paste layer 21, the sintering temperature is approximately 150° C., for example.

After the initial process of the heating process, the high-temperature process of the heating process is performed. In the high-temperature process, Ag particles in the metal paste layer 21 are sufficiently sintered. A temperature at this time is equal to or higher than a sintering temperature of the Ag particles, and is lower than a melting point of the Ag particles. If necessary, oxygen may be contained in an atmosphere in the heating furnace 800, for the purpose of accelerating sintering reaction. A material referred to as micro Ag particles requires such oxygen content. In contrast, a material referred to as nano Ag particles is active even at a room temperature, and does not require such oxygen content.

(Effects)

According to this embodiment, when the vibrator 51 (FIG. 4) attached to the penetrating member 31 penetrating the metal paste layer 21 is vibrated, the metal paste layer 21 is vibrated. With this configuration, voids in the metal paste layer 21 are more easily removed. Consequently, the joining layer 41 obtained from the metal paste layer 21 is more densified. Thus, quality of the joining layer 41 can be enhanced. Specifically, strength of the joining layer 41 per se can be enhanced. Further, joining strength between the joining layer 41 and a member joined to the joining layer 41 can be enhanced. Further, the thickness of the joining layer 41 is reduced. With this configuration, thermal resistance of the joining layer 41 is reduced. Consequently, heat dissipation performance of the power module 41 can be enhanced. Further, internal stress of the joining layer 41 is made uniform, and therefore occurrence of cracks in the joining layer 41 can be reduced.

In the heating process of the metal paste layer 21, Ag particles are sintered at a temperature lower than a melting point of the Ag particles. With this configuration, a temperature of the process of heating the metal paste layer 21 can be reduced, and at the same time, a material having a higher melting point can be used as a material of the metal paste layer 21. When a heating temperature is reduced, deterioration in joining strength under thermal stress can be reduced. Further, when a material having a higher melting point can be used as compared to a case where a material of the metal paste layer 21 is limited to a material having a low melting point, a material having higher heat conductivity can be selected.

It is preferable that vibration of the vibrator 51 be stopped before the high-temperature process of the heating process. With this configuration, sintering reaction in the high-temperature process is less liable to be hindered by vibration.

The heating process of the metal paste layer 21 is performed without application of a pressure of pressing both the power semiconductor chip 70 and the circuit substrate 10 from the outside through the intermediate structure 71B. With this configuration, the power semiconductor chip 70 can be less liable to be damaged due to pressure application. Note that a pressure may be applied in so far as such damage is avoided. In such a case, the joining layer 41 obtained from the metal paste layer 21 can be more densified.

An electric signal may be applied to the vibrator 51 by using a current path that passes through the penetrating member 31. In such a case, a current path for applying an electric signal to the vibrator 51 can be easily secured.

The penetrating member 31 may include first and second end portions (a left end portion and a right end portion in FIG. 4) projecting from the metal paste layer 21. In other words, the penetrating member 31 may include first and second end portions (a left end portion and a right end portion in FIG. 2) projecting from the joining layer 41. In such a case, attachment of the vibrator 51 to the penetrating member 31 is easily performed. Further, connection between the penetrating member 31 and an electrical wire is easily performed.

The penetrating member 31 is made of metal. With this configuration, the penetrating member 31 has high electrical conductivity and heat conductivity. When the penetrating member 31 is made of Au, Ag, or Cu, diffusion bonding between the penetrating member 31 and Ag particles of the metal paste layer 21 easily occurs. With this configuration, contact points are formed between the penetrating member 31 and the Ag particles. As a result, joining strength between the joining layer 41 and the penetrating member 31 can be enhanced.

It is preferable that the vibrator 51 be vibrated such that amplitude of the penetrating member 31 is equal to or less than the thickness of the metal paste layer 21. In such a case, the metal paste layer 21 or the joining layer 41 formed from the metal paste layer 21 are less liable to peel off due to excessive vibration.

It is preferable that stacking of the power semiconductor chip 70 and the circuit substrate 10 interposing the intermediate structure 71B be performed such that each of one side (upper side in FIG. 4) and another side (lower side in FIG. 4) of the penetrating member 31 in a stacking direction (vertical direction in FIG. 4, i.e., thickness direction) faces the metal paste layer 21. With this configuration, in the metal paste layer 21, vibration can be applied to each of an upper side and a lower side of the penetrating member 31. Consequently, voids in the metal paste layer 21 can be more uniformly removed.

When the power semiconductor chip 70 and the circuit substrate 10 are stacked, it is preferable that the penetrating member 31 (FIG. 3) be disposed along a diagonal direction of the power semiconductor chip 70. In such a case, a moving distance, which is necessary for the voids in the metal paste layer 21 to be moved out of the metal paste layer 21, is reduced. Consequently, voids are easily removed from the metal paste layer 21.

(Modifications)

In the first embodiment, as illustrated in FIG. 6, a cross-sectional shape of the penetrating member 31 perpendicular to an extending direction is a cylindrical shape. With this configuration, vibration more easily uniformly propagates from the penetrating member 31 into the metal paste layer 21 disposed around the penetrating member 31. Further, this cross-sectional shape is not a hollow shape but is a solid shape. With this configuration, reduction in strength and increase in thermal resistance due to a hollow portion can be less liable to occur. However, the cross-sectional shape of the penetrating member 31 is not limited to the above shape. FIG. 7 to FIG. 10 are diagrams respectively illustrating penetrating members 31a to 31d, which are modifications of the penetrating member 31 (FIG. 6).

Figure 7:
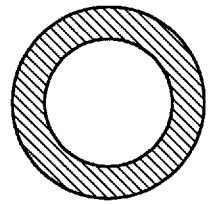
FIG. 7 is a diagram illustrating a first modification of the configuration of FIG. 6.

With reference to FIG. 7, the penetrating member 31a has a cylindrical shape and has a hollow shape. When vibration is applied to one end of the penetrating member 31a, vibration of air in the hollow area propagates toward another end. With this configuration, propagation of vibration in the penetrating member 31 is accelerated. Further, with the cylindrical shape, vibration more easily uniformly propagates from the penetrating member 31a into the metal paste layer 21 disposed around the penetrating member 31a. Further, when the power module 81 (FIG. 2) is used, a coolant may pass through the hollow area. In this manner, the intermediate structure 71A can be cooled.

Figure 8:
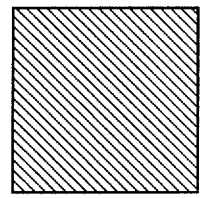
FIG. 8 is a diagram illustrating a second modification of the configuration of FIG. 6.
Figure 9:
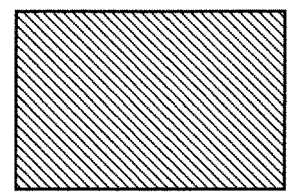
FIG. 9 is a diagram illustrating a third modification of the configuration of FIG. 6.

With reference to FIG. 8, the penetrating member 31b has a square shape. With reference to FIG. 9, the penetrating member 31c has a rectangular shape.

Figure 10:
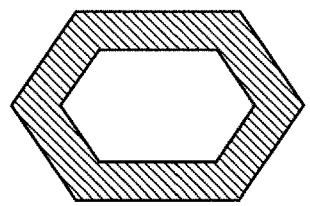
FIG. 10 is a diagram illustrating a fourth modification of the configuration of FIG. 6.

With reference to FIG. 10, the penetrating member 31d has a hollow shape. Further, the penetrating member 31d has a honeycomb shape, and hence includes six apexes. When a large number of apexes as those above are vibrated, intense vibration can be propagated in a large number of directions in the metal paste layer 21. When sides extending along an in-plane direction (horizontal direction in FIG. 10) of the metal paste layer 21 out of the sides of the honeycomb shape are set to be relatively long, vibration propagation in the metal paste layer 21 is more satisfactory.

Figure 11:
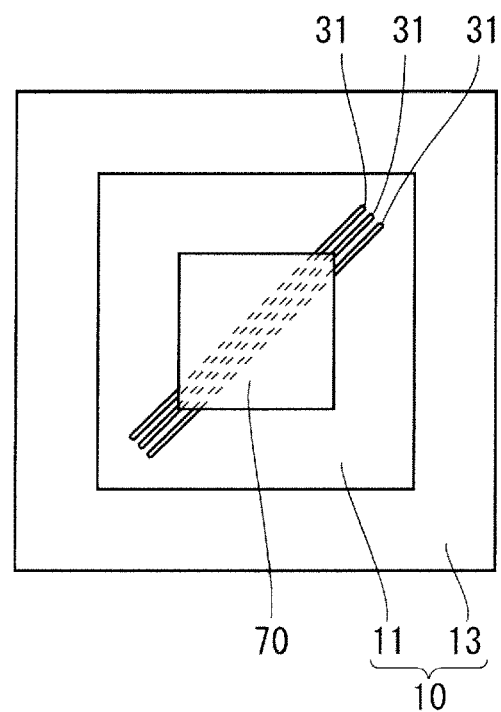
FIG. 11 is a diagram illustrating a modification of the configuration of FIG. 1.

FIG. 11 is a diagram illustrating a modification of the configuration of FIG. 1. In FIG. 1 (first embodiment), one penetrating member 31 is used. However, in this modification, a plurality of penetrating members 31 are used. In such a case, voids located far from a certain penetrating member 31 may be located near another penetrating member 31. Consequently, voids can be more securely moved out.

The first embodiment and the modifications of the first embodiment describe an example in which metal particles dispersed in the metal paste layer 21 are Ag particles. However, instead of Ag particles, other metal particles may be used. For example, Cu particles may be used.

Further, in the above description, heating of the metal paste layer 21 for forming the joining layer 41 is performed at a temperature lower than a melting point. Instead of this configuration, heating may be performed at a temperature equal to or higher than a melting point. In other words, a plurality of metal particles may be fused, instead of being sintered, and then be solidified. In such a case, the joining layer 41 is made of a non-sintered material. Typically, the joining layer 41 is made of solder. Particularly when the power semiconductor chip 70 includes a semiconductor layer made of a non-wide-bandgap semiconductor (typically Si), required levels of strength and heat conductivity of the joining layer 41 are somewhat lower as compared to a case where the power semiconductor chip 70 includes a semiconductor layer made of a wide-bandgap semiconductor. Therefore, the use of the joining layer 41 made of solder, instead of a sintered material, is allowed in many cases.

Further, in the above description, the power semiconductor chip 70 (FIG. 2) is stacked above the circuit substrate 10, with the intermediate structure 71A being interposed between the power semiconductor chip 70 and the circuit substrate 10. However, the power semiconductor chip 70 may be stacked above a support member other than the circuit substrate 10. In other words, in the above description, the power semiconductor chip 70 (FIG. 4) may be stacked above a support member other than the circuit substrate 10, with the intermediate structure 71B being interposed between the power semiconductor chip 70 and the support member.

Second Embodiment (Configuration)

Figure 12:
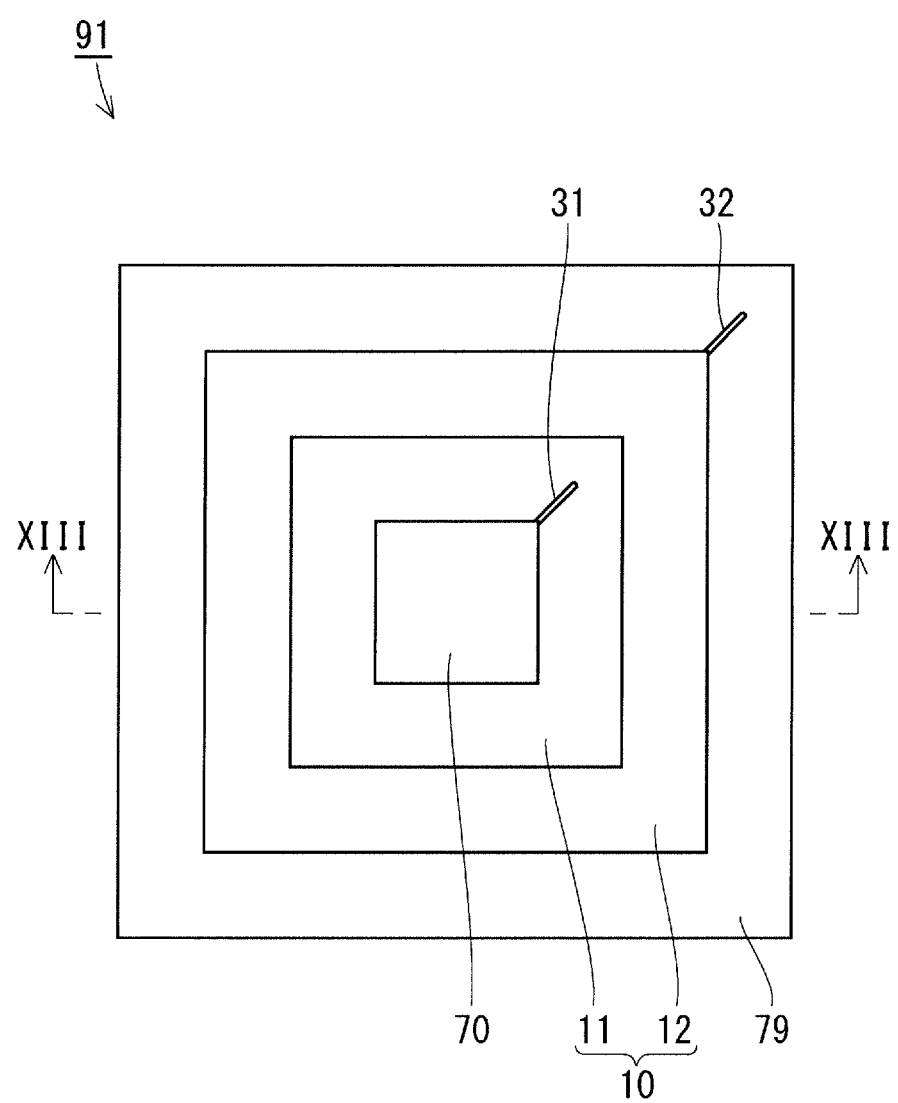
FIG. 12 is a plan view schematically illustrating a configuration of a power semiconductor device according to a second embodiment of the present invention.

FIG. 12 is a plan view schematically illustrating a configuration of a power module 91 (power semiconductor device) according to a second embodiment of the present invention. FIG. 13 is a schematic cross-sectional view taken along the line XIII-XIII of FIG. 12.

The power module 91 includes a heat dissipation member 79 (support member of the second embodiment), an intermediate structure 72A, and a power semiconductor chip 70. The intermediate structure 72A is provided on the heat dissipation member 79. The power semiconductor chip 70 is provided on the intermediate structure 72A. The power semiconductor chip 70 is joined to the heat dissipation member 79 by the intermediate structure 72A. The intermediate structure 72A includes a joining layer 41, a penetrating member 31, a joining layer 42, a penetrating member 32 (second penetrating member), and a circuit substrate 10. The joining layer 41 and the joining layer 42 are respectively joined to a metal circuit pattern 11 and a metal circuit pattern 12 of the circuit substrate 10.

Materials for the joining layer 42 and the penetrating member 32 may be the same as the materials for the joining layer 41 and the penetrating member 31 described in the first embodiment and the modifications of the first embodiment. The shape of the penetrating member 32 may be the same as the shape of the penetrating member 31 described in the first embodiment and the modifications of the first embodiment. Disposition of the penetrating member 32 with respect to the joining layer 42 may be the same as the disposition of the penetrating member 31 with respect to the joining layer 41 described in the first embodiment and the modifications of the first embodiment. Further, a plurality of penetrating members 31 (see FIG. 11) may be used, and a plurality of penetrating members 32 may be used.

(Manufacturing Method)

Figure 14:
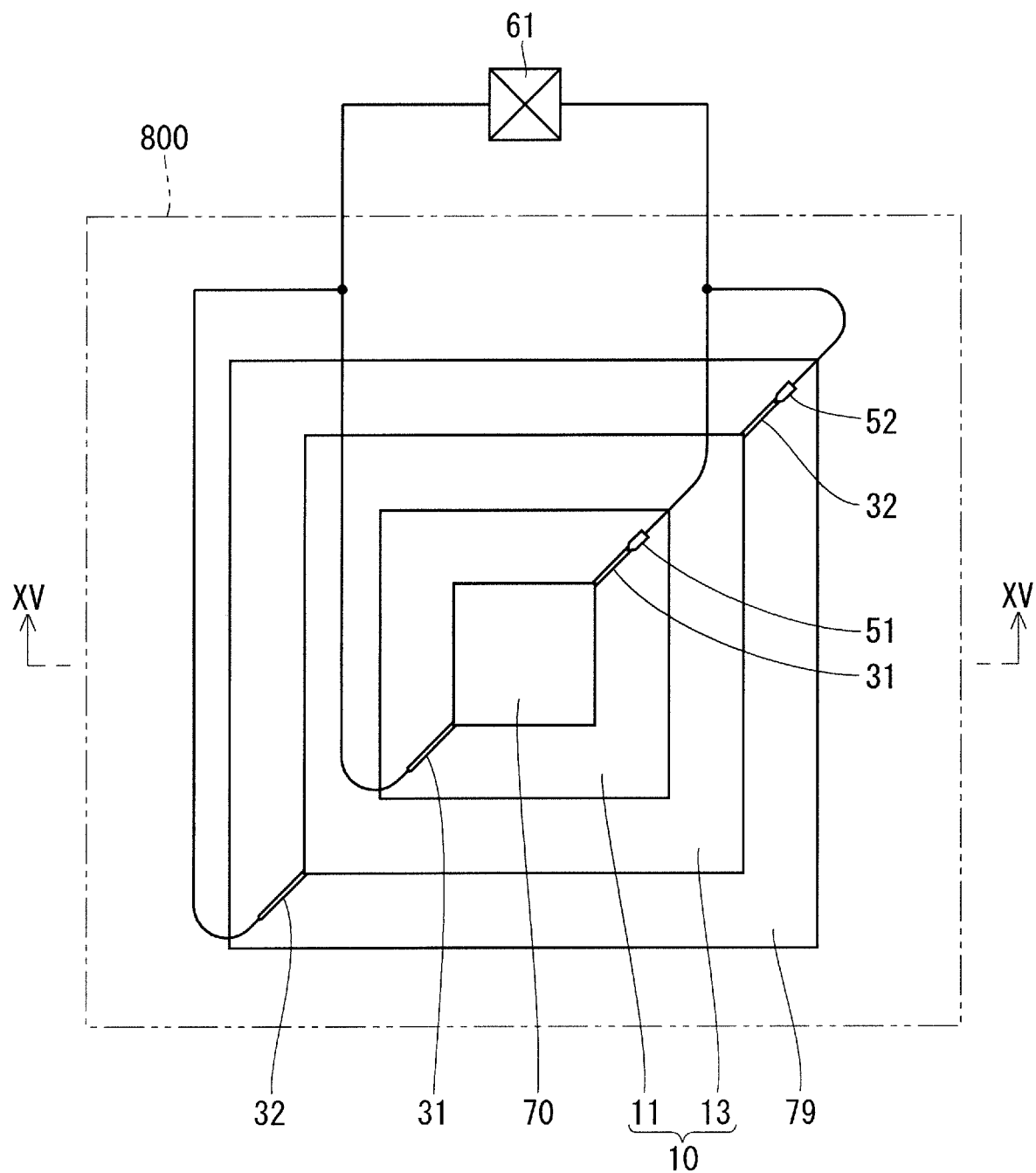
FIG. 14 is a plan view schematically illustrating one process of a manufacturing method of the power semiconductor device according to the second embodiment of the present invention.
Figure 15:
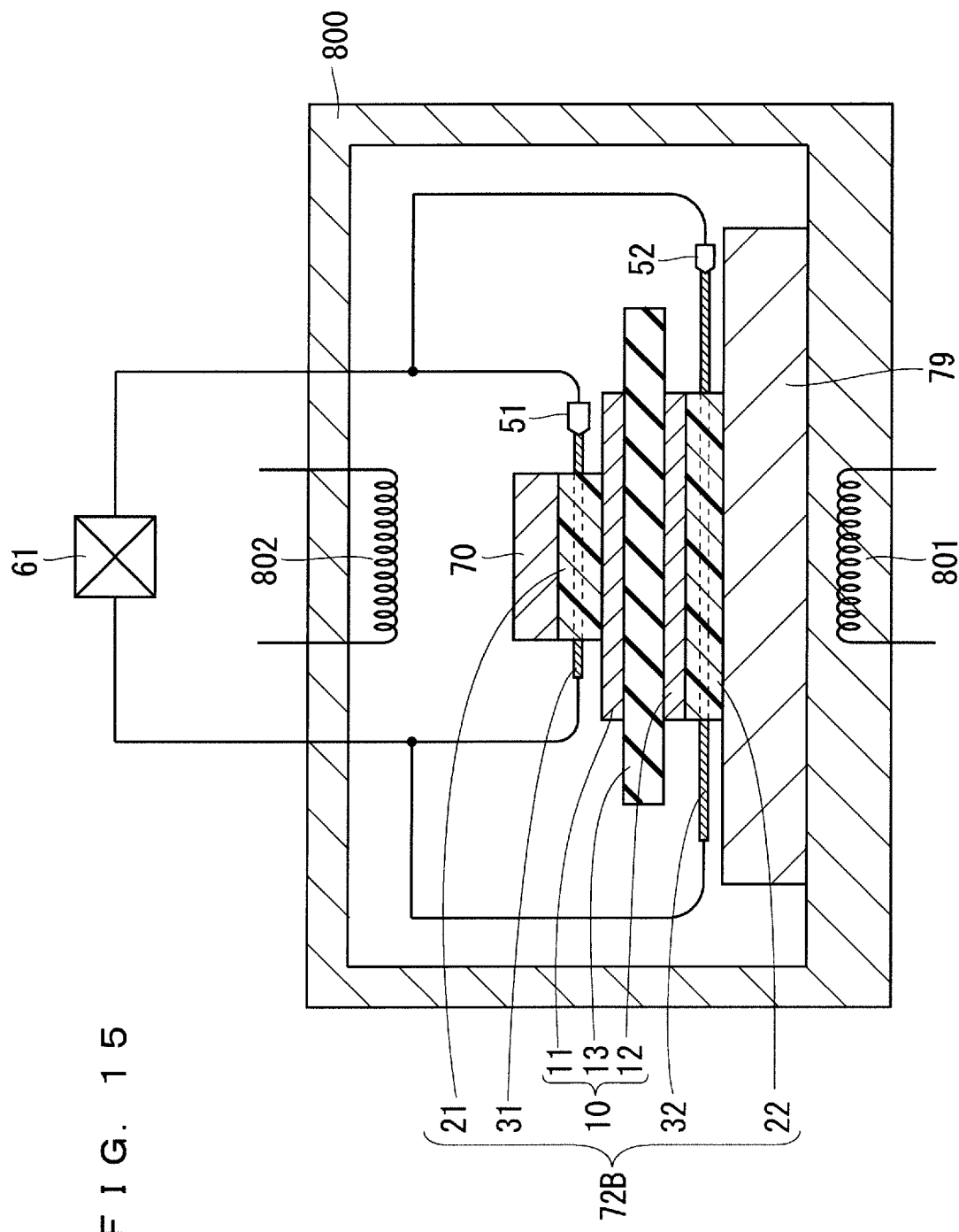
FIG. 15 is a schematic cross-sectional view taken along the line XV-XV of FIG. 14.

FIG. 14 is a plan view schematically illustrating one process of a manufacturing method of the power module 91 according to the second embodiment. FIG. 15 is a schematic cross-sectional view taken along the line XV-XV of FIG. 14.

The power semiconductor chip 70 and the heat dissipation member 79 are stacked, with an intermediate structure 72B (FIG. 15) being interposed between the power semiconductor chip 70 and the heat dissipation member 79. The intermediate structure 72B includes a circuit substrate 10, a metal paste layer 21, a penetrating member 31, a metal paste layer 22 (second metal paste layer), and a penetrating member 32. The circuit substrate 10 is stacked below the power semiconductor chip 70, with the metal paste layer 21 being interposed between the circuit substrate 10 and the power semiconductor chip 70. The metal paste layer 22 is disposed between the heat dissipation member 79 as a support member and the circuit substrate 10, and contains a plurality of metal particles (plurality of second metal particles). The penetrating member 32 penetrates the metal paste layer 22. A material for the metal paste layer 22 may be the same as the material for the metal paste layer 21 described in the first embodiment and the modifications of the first embodiment. Disposition of the penetrating member 32 with respect to the metal paste layer 22 may be the same as the disposition of the penetrating member 31 with respect to the metal paste layer 21 described in the first embodiment and the modifications of the first embodiment.

Next, the stacked material is transferred into a heating furnace 800. Next, by using a heater 801 and a heater 802 provided in the heating furnace 800, the metal paste layer 21 and the metal paste layer 22 are heated. As described in the first embodiment, a heating process includes an initial process, and a high-temperature process that follows the initial process. In the initial process, the metal paste layer 21 and the metal paste layer 22 are heated within a temperature range of a first temperature or below. In the high-temperature process, the metal paste layer 21 and the metal paste layer 22 are heated up to a second temperature, which is higher than the first temperature. The second temperature is lower than a melting point of the Ag particles.

In the initial process of the heating process, an organic solvent in the metal paste layer 21 and the metal paste layer 22 is evaporated prior to the sintering reaction. As a result, voids are formed. At this time, if a pressure of pressing both the power semiconductor chip 70 and the heat dissipation member 79 is applied from the outside through the intermediate structure 72B, removal of the voids from the metal paste layer 21 and the metal paste layer 22 is accelerated. However, the power semiconductor chip 70 may be damaged due to such a pressure. In view of this, in this embodiment, heating of the metal paste layer 21 and the metal paste layer 22 is performed without pressure application from the outside. Note that a pressure may be applied in so far as such damage is avoided.

After voids are formed as described above, a vibrator 51, which is attached to the penetrating member 31 penetrating the metal paste layer 21, and a vibrator 52 (second vibrator), which is attached to the penetrating member 32 penetrating the metal paste layer 22, are vibrated. In the second embodiment, the vibrator 51 and the vibrator 52 are electrically connected in parallel; these vibrations are, therefore, generated by an electric signal from one signal generator 61. As a result of vibration, voids are moved out of the metal paste layer 21 and the metal paste layer 22. Consequently, an amount of voids in the metal paste layer 21 and the metal paste layer 22 is reduced.

Note that the timing of starting vibration may be before voids are formed. Further, vibration of the vibrator 51 and vibration of the penetrating member 31 due to the vibration of the vibrator 51 may be the same as those described in the first embodiment. Further, vibration of the vibrator 52 and vibration of the penetrating member 32 due to the vibration of the vibrator 52 may be the same as vibration of the vibrator 51 and vibration of the penetrating member 31 due to the vibration of the vibrator 51 described in the first embodiment.

The heating process is performed until metal particles in the metal paste layer 21 and metal particles in the metal paste layer 22 are sintered. A relationship between the timing of the heating process and the timing of the vibration process may be the same as a relationship between the timing of the heating process and the timing of the vibration process in the first embodiment. Further, a condition of the heating process may be the same as the condition in the first embodiment as well.

Note that configuration other than the above configuration is substantially the same as the configuration of the first embodiment described above. Thus, the same or equivalent elements are denoted by the same reference signs to omit repeated description thereof.

According to this embodiment, when the vibrator 52 attached to the penetrating member 32 penetrating the metal paste layer 22 is vibrated, the metal paste layer 22 is vibrated. With this configuration, voids in the metal paste layer 22 are more easily removed. Consequently, the joining layer 42 obtained from the metal paste layer 22 is more densified. Thus, quality of the joining layer 42 can be enhanced. Specifically, strength of the joining layer 42 per se can be enhanced. Further, joining strength between the joining layer 42 and a member joined to the joining layer 42 can be enhanced. Further, the thickness of the joining layer 42 is reduced. With this configuration, thermal resistance of the joining layer 42 is reduced. Consequently, heat dissipation performance of the power module 91 can be enhanced. Further, internal stress of the joining layer 42 is made uniform, and therefore occurrence of cracks in the joining layer 42 can be reduced. Further, effects similar to the effects described in the first embodiment can be achieved.

(Modifications)

Further, in the second embodiment, heating of the metal paste layer 21 and the metal paste layer 22 for forming the joining layer 41 and the joining layer 42 is performed at a temperature lower than a melting point. Instead of this configuration, similarly to the modification of the first embodiment, heating may be performed at a temperature equal to or higher than a melting point. In other words, a plurality of metal particles may be fused, instead of being sintered, and then be solidified. In such a case, the joining layer 41 and the joining layer 42 are made of a non-sintered material. Typically, the joining layer 41 and the joining layer 42 are made of solder. Particularly when the power semiconductor chip 70 includes a semiconductor layer made of a non-wide-bandgap semiconductor (typically Si), required levels of strength and heat conductivity of the joining layer 41 and the joining layer 42 are somewhat lower as compared to a case where the power semiconductor chip 70 includes a semiconductor layer made of a wide-bandgap semiconductor. Therefore, the use of the joining layer 41 and the joining layer 42 made of solder is allowed in many cases.

A completed power module 81 (FIG. 1 and FIG. 2: first embodiment) may be stacked above the heat dissipation member 79, with an intermediate structure including the metal paste layer 22 and the penetrating member 32 being interposed between the completed power module 81 and the heat dissipation member 79. Even in such a case, through a process similar to the process of the second embodiment, the joining layer 42 can be formed from the metal paste layer 22.

The penetrating member 31 may be omitted. Even in such a case, an effect of reducing the voids in the metal paste layer 21 achieved by vibration from the penetrating member 32 propagating to the metal paste layer 21 may be achieved in some degree. The penetrating member 32 may be omitted, instead of the penetrating member 31.

Third Embodiment

Figure 16:
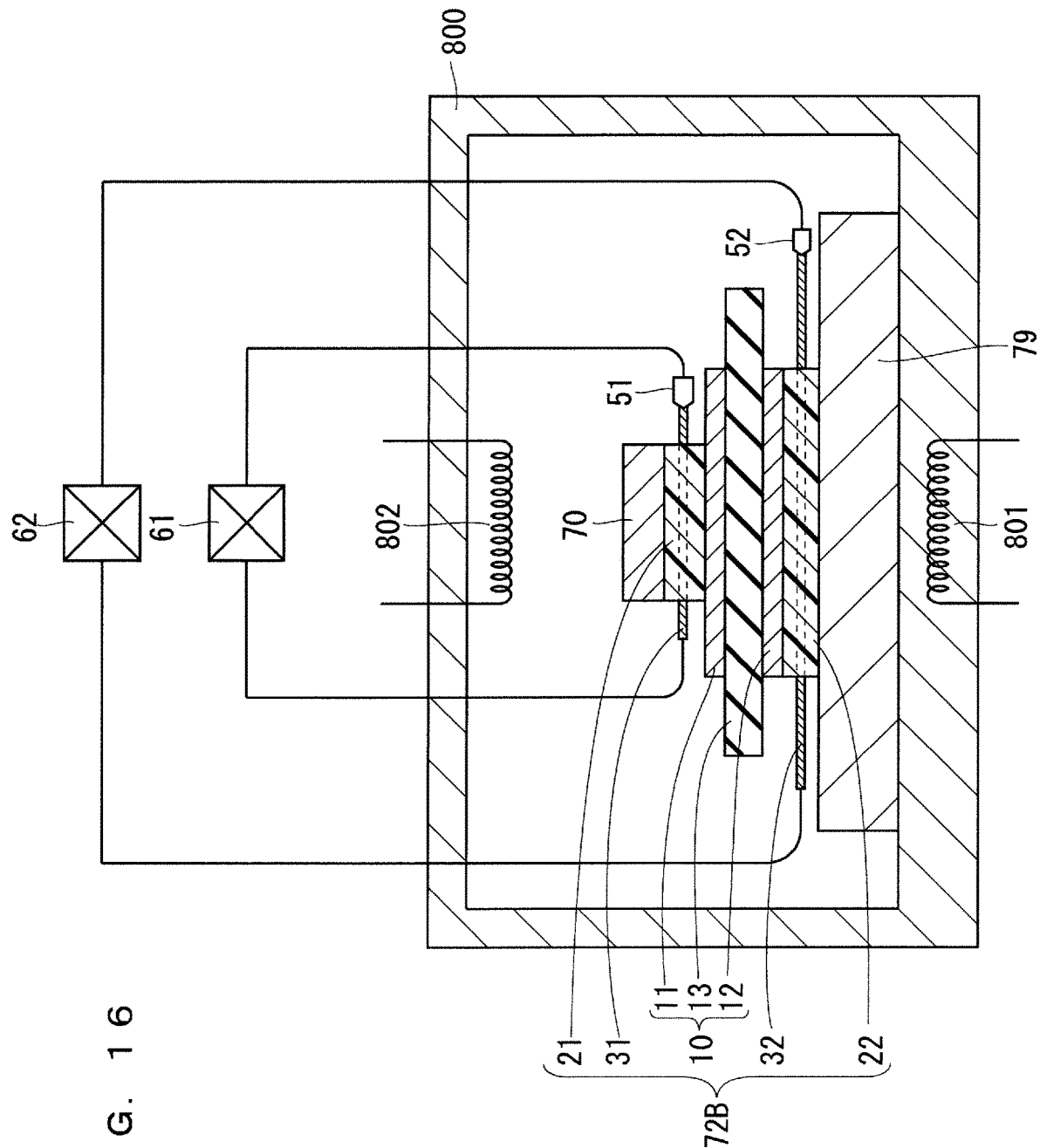
FIG. 16 is a cross-sectional view schematically illustrating one process of a manufacturing method of the power semiconductor device according to a third embodiment of the present invention.

In a third embodiment of the present invention, a manufacturing method of the power module 91 (FIG. 13 and FIG. 14) different from the manufacturing method in the second embodiment will be described. FIG. 16 is a cross-sectional view schematically illustrating one process of a manufacturing method of the power module 91 according to the third embodiment. In this embodiment, the vibrator 51 and the vibrator 52 are respectively driven by a signal generator 61 and a signal generator 62. With this configuration, a period of time in which the vibrator 51 is vibrated and a period of time in which the vibrator 52 is vibrated can be caused to be at least partially different from each other. Further, for example, intensity, frequency and a waveform of vibration can be caused to be different. Note that configuration other than the above configuration is substantially the same as the configuration of the second embodiment and modifications of the second embodiment described above. Thus, the same or equivalent elements are denoted by the same reference signs to omit repeated description thereof.

According to this embodiment (FIG. 16), methods of applying vibration to the metal paste layer 21 and the metal paste layer 22 can be diversified, as compared to a case where the penetrating member 31 and the penetrating member 32 are simultaneously driven by a common signal generator 61 (FIG. 15). Consequently, the joining layer 41 and the joining layer 42 obtained from the metal paste layer 21 and the metal paste layer 22 can be more densified.

Fourth Embodiment

Figure 17:
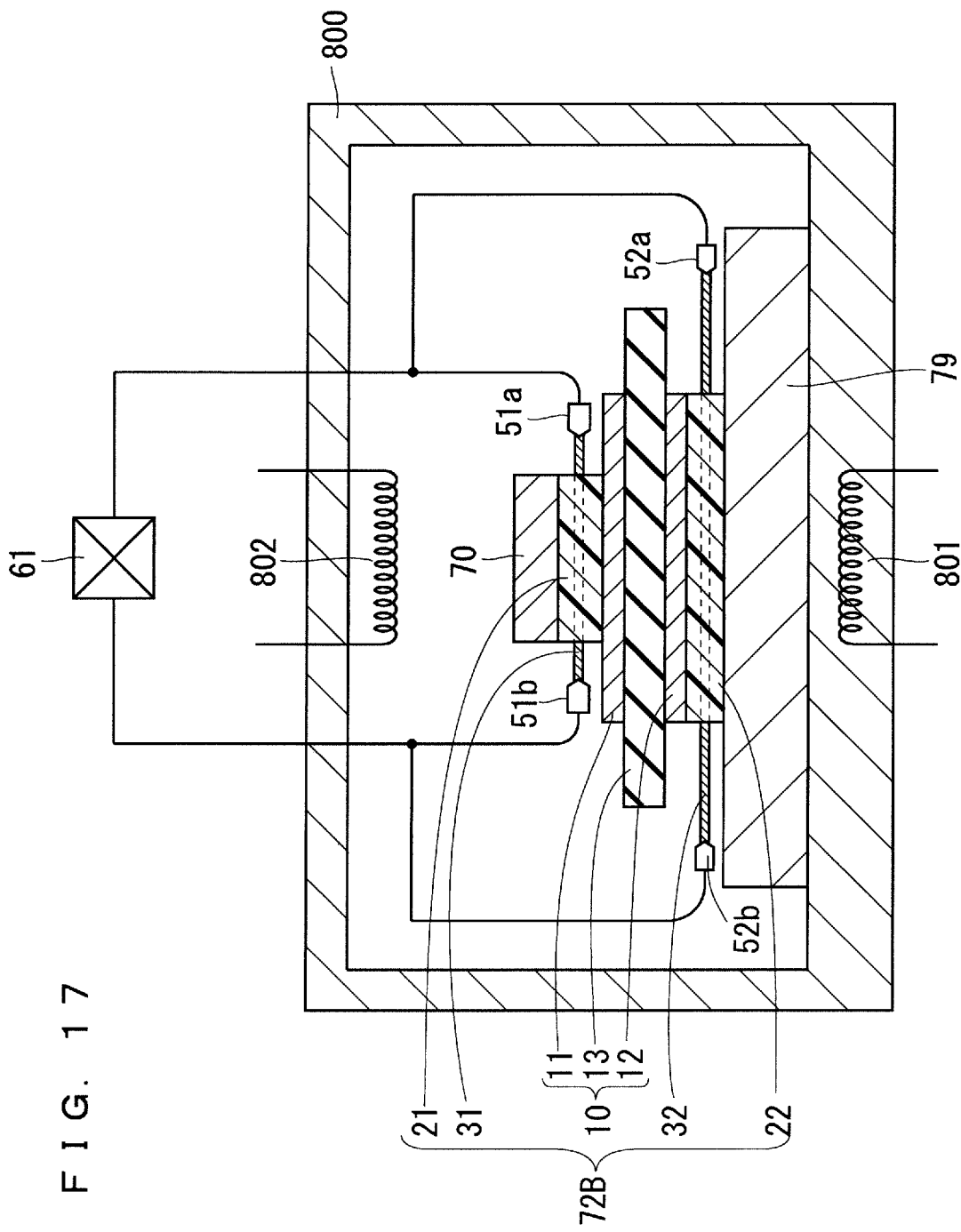
FIG. 17 is a cross-sectional view schematically illustrating one process of a manufacturing method of the power semiconductor device according to a fourth embodiment of the present invention.

In a fourth embodiment of the present invention, a manufacturing method of the power module 91 (FIG. 13 and FIG. 14) different from the manufacturing method in the second and third embodiments will be described. FIG. 17 is a cross-sectional view schematically illustrating one process of a manufacturing method of the power module 91 according to the fourth embodiment.

In this embodiment, a vibrator 51a (first end-portion vibrator) and a vibrator 51b (second end-portion vibrator) are used as a plurality of vibrators (first vibrators) attached to the penetrating member 31. The vibrator 51a and the vibrator 51b are respectively attached to a first end portion and a second end portion (a left end portion and a right end portion in FIG. 17) of the penetrating member 31. With this configuration, a first series structure, in which the vibrator 51a and the vibrator 51b are electrically connected in series by the penetrating member 31, is formed.

Similarly, a vibrator 52a and a vibrator 52b are used as a plurality of vibrators (second vibrators) attached to the penetrating member 32. The vibrator 52a and the vibrator 52b are respectively attached to one end portion and another end portion (a left end portion and a right end portion in FIG. 17) of the penetrating member 32. With this configuration, the vibrator 52a and the vibrator 52b are electrically connected in series by the penetrating member 32. With this configuration, a second series structure, in which the vibrator 52a and the vibrator 52b are electrically connected in series by the penetrating member 32, is formed.

In this embodiment, a parallel structure, in which the first and second series structures are connected in parallel, is formed. When an electric signal is applied from the signal generator 61 to this parallel structure, the vibrator 51a, the vibrator 51b, the vibrator 52a, and the vibrator 52b are vibrated.

Note that configuration other than the above configuration is substantially the same as the configuration of the second embodiment and modifications of the second embodiment described above. Thus, the same or equivalent elements are denoted by the same reference signs to omit repeated description thereof.

According to this embodiment, vibrators are attached to both sides of the penetrating member 31. Therefore, more sufficient vibration can be applied to the metal paste layer 21. Further, vibrators are attached to both sides of the penetrating member 32. Therefore, more sufficient vibration can be applied to the metal paste layer 22. Further, owing to the series structures and the parallel structure described above, an electric signal can be applied to the vibrator 51a, the vibrator 51b, the vibrator 52a, and the vibrator 52b by a common signal generator 61.

Figure 18:
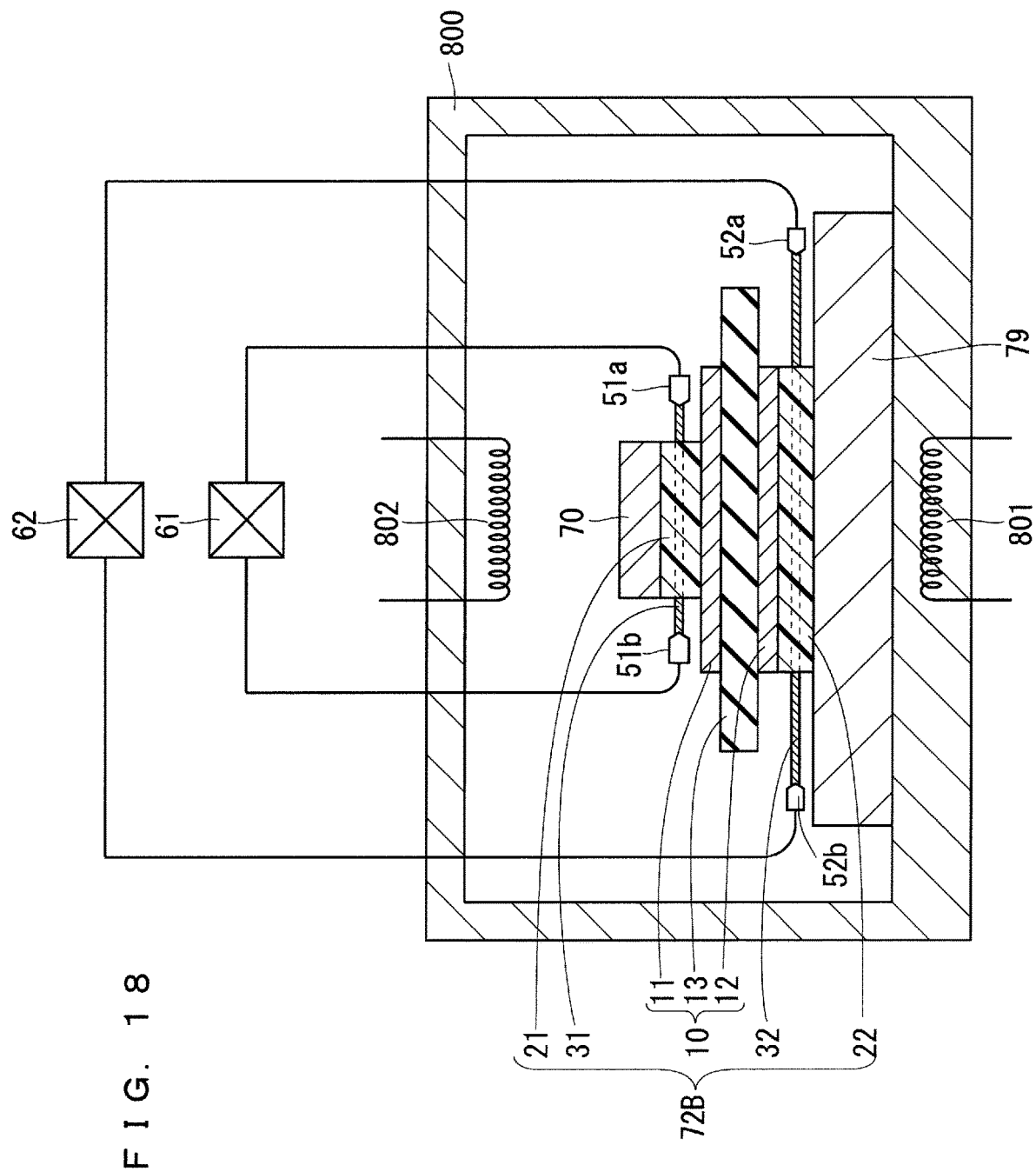
FIG. 18 is a diagram illustrating a first modification of the process of FIG. 17.

FIG. 18 is a diagram illustrating a first modification of the process of FIG. 17. In this modification, electric signals are applied to the first and second series structures described above respectively by the signal generator 61 and the signal generator 62. According to this modification, methods of applying vibration to the metal paste layer 21 and the metal paste layer 22 can be diversified, as compared to this embodiment above. Consequently, the joining layer 41 and the joining layer 42 obtained from the metal paste layer 21 and the metal paste layer 22 can be more densified. Investigation made by an inventor of the present invention showed that using this modification led a void reduction effect to be increased to approximately three times as large as a void reduction effect of this embodiment above, by combining a period of time in which only the penetrating member 31 is vibrated, a period of time in which only the penetrating member 32 is vibrated, and a period of time in which both the penetrating member 31 and the penetrating member 32 are vibrated.

Figure 19:
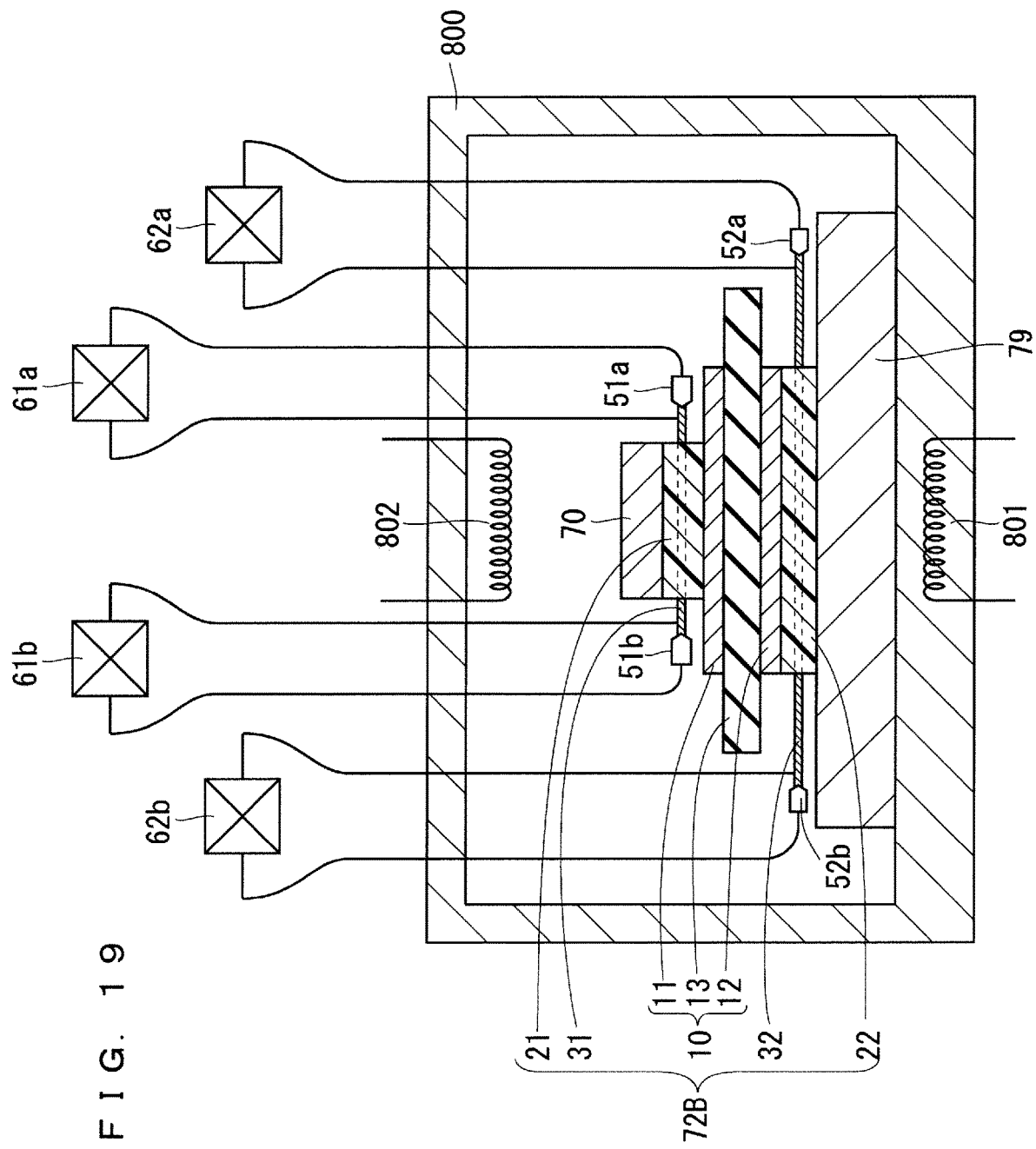
FIG. 19 is a diagram illustrating a second modification of the process of FIG. 17.

FIG. 19 is a diagram illustrating a second modification of the process of FIG. 17. In this modification, electric signals are applied to the vibrator 51a, the vibrator 51b, the vibrator 52a, and the vibrator 52b respectively by a signal generator 61a, a signal generator 61b, a signal generator 62a, and a signal generator 62b. According to this modification, only one of the vibrator 51a and the vibrator 51b can be vibrated at least temporarily. Further, only one of the vibrator 52a and the vibrator 52b can be vibrated at least temporarily. According to this second modification, methods of applying vibration to the metal paste layer 21 and the metal paste layer 22 can be further diversified, as compared to this embodiment above and the first modification above. Consequently, the joining layer 41 and the joining layer 42 obtained from the metal paste layer 21 and the metal paste layer 22 can be more densified.

Fifth Embodiment (Configuration)

Figure 20:
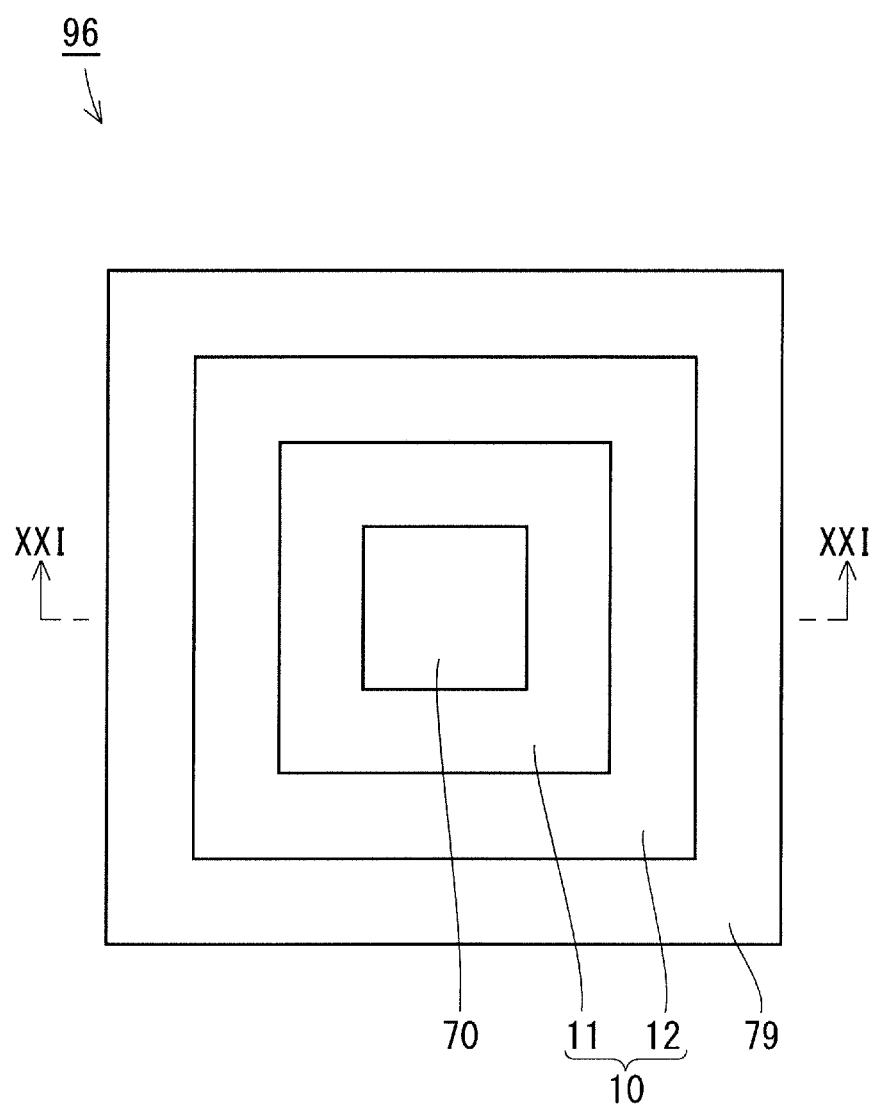
FIG. 20 is a plan view schematically illustrating a configuration of a power semiconductor device according to a fifth embodiment of the present invention.
Figure 21:
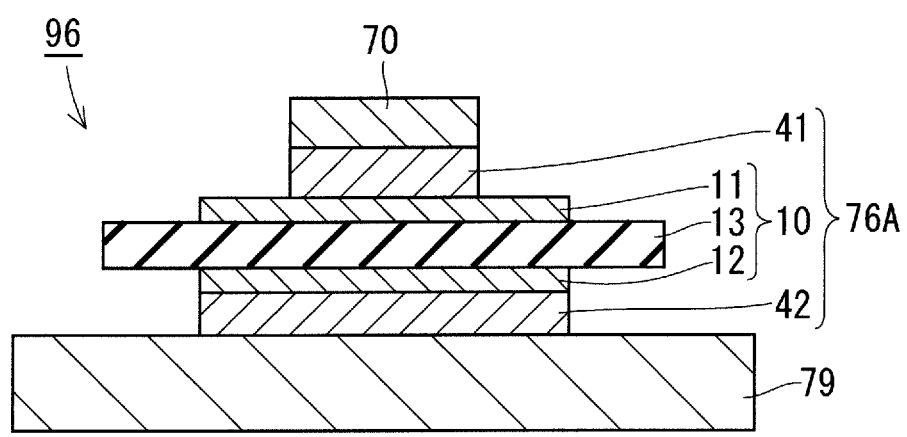
FIG. 21 is a schematic cross-sectional view taken along the line XXI-XXI of FIG. 20.

FIG. 20 is a plan view schematically illustrating a configuration of a power module 96 (power semiconductor device) according to a fifth embodiment of the present invention. FIG. 21 is a schematic cross-sectional view taken along the line XXI-XXI of FIG. 20. The intermediate structure 76A (FIG. 21) of the power module 96 includes neither the penetrating member 31 nor the penetrating member 32, unlike the intermediate structure 72A of the power module 91 (FIG. 13: second embodiment). Configuration other than this configuration is substantially the same as the configuration of the power module 91 described above. Thus, the same or equivalent elements are denoted by the same reference signs to omit repeated description thereof.

(Manufacturing Method)

Figure 22:
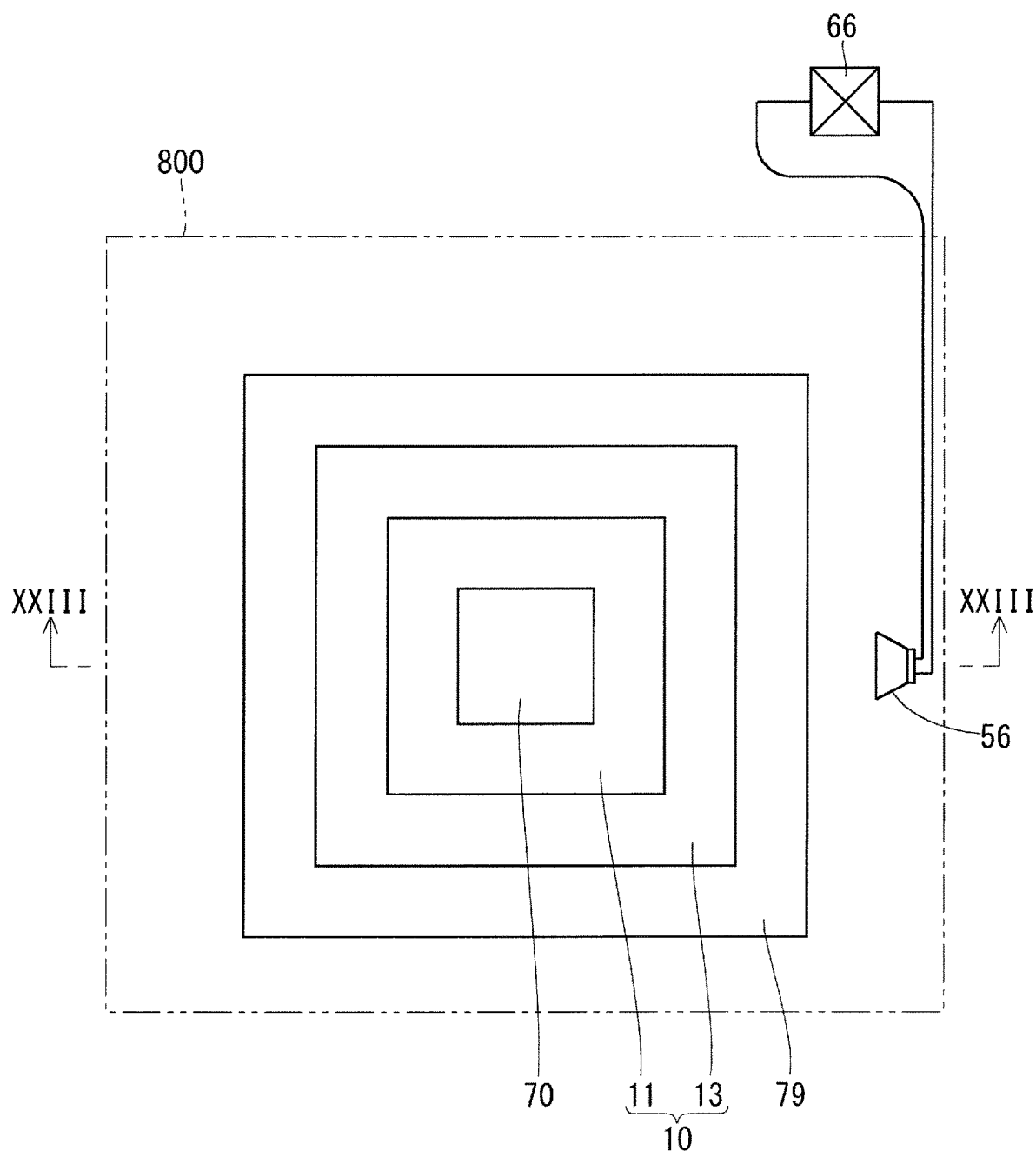
FIG. 22 is a plan view schematically illustrating one process of a manufacturing method of the power semiconductor device according to the fifth embodiment of the present invention.
Figure 23:
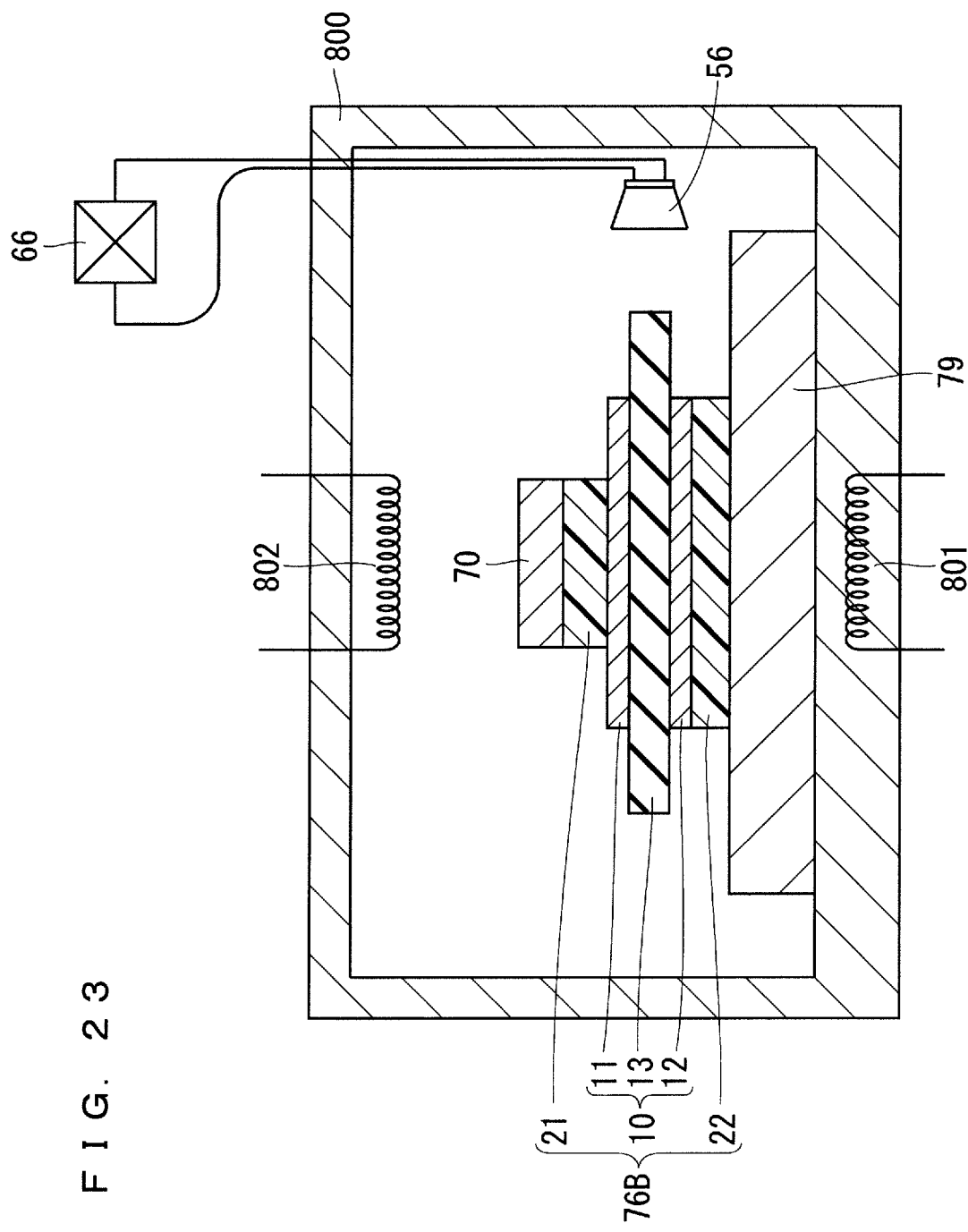
FIG. 23 is a schematic cross-sectional view taken along the line XXIII-XXIII of FIG. 22.

FIG. 22 is a plan view schematically illustrating one process of a manufacturing method of the power module 96 according to the fifth embodiment. FIG. 23 is a schematic cross-sectional view taken along the line XXIII-XXIII of FIG. 22.

The power semiconductor chip 70 and the heat dissipation member 79 (support member in the fifth embodiment) are stacked, with an intermediate structure 76B (FIG. 23) being interposed between the power semiconductor chip 70 and the heat dissipation member 79. The intermediate structure 76B includes neither the penetrating member 31 nor the penetrating member 32, unlike the intermediate structure 72B (FIG. 15: second embodiment). Configuration other than this configuration is substantially the same as the configuration of the intermediate structure 72B described above. Thus, the same or equivalent elements are denoted by the same reference signs to omit repeated description thereof.

Next, the stacked material is transferred into a heating furnace 800. Next, by using a heater 801 and a heater 802 provided in the heating furnace 800, the metal paste layer 21 and the metal paste layer 22 are heated. As described in the first embodiment, a heating process includes an initial process, and a high-temperature process that follows the initial process. In the initial process, the metal paste layer 21 and the metal paste layer 22 are heated within a temperature range of a first temperature or below. In the high-temperature process, the metal paste layer 21 and the metal paste layer 22 are heated up to a second temperature, which is higher than the first temperature. The second temperature is lower than a melting point of the Ag particles.

In the initial process of the heating process, an organic solvent in the metal paste layer 21 and the metal paste layer 22 is evaporated prior to the sintering reaction. As a result, voids are formed. At this time, if a pressure of pressing both the power semiconductor chip 70 and the heat dissipation member 79 is applied from the outside through the intermediate structure 76B, removal of the voids from the metal paste layer 21 and the metal paste layer 22 is accelerated. However, the power semiconductor chip 70 may be damaged due to such a pressure. In view of this, in this embodiment, heating of the metal paste layer 21 and the metal paste layer 22 is performed without pressure application from the outside. Note that a pressure may be applied in so far as such damage is avoided.

After voids are formed as described above, an electric signal is applied to a speaker 56 provided in the heating furnace 800 from a signal generator 66. With this configuration, an acoustic wave radiation process of emitting acoustic waves from the speaker 56 toward the metal paste layer 21 and the metal paste layer 22 is performed. The speaker 56 is disposed outside of the stacked material of the power semiconductor chip 70 and the heat dissipation member 79 interposing the intermediate structure 76B. It is preferable that the speaker 56 be disposed away from the stacked material in an in-plane direction (horizontal direction in FIG. 23). In such a case, acoustic waves are propagated between the speaker 56 and the stacked material, with an atmosphere in the heating furnace 800 being a medium.

Through the acoustic wave radiation process, voids are moved out of the metal paste layer 21 and the metal paste layer 22. Consequently, an amount of voids in the metal paste layer 21 and the metal paste layer 22 is reduced. Note that the timing of starting generation of acoustic waves may be before voids are formed.

The heating process is performed until metal particles in the metal paste layer 21 and metal particles in the metal paste layer 22 are sintered. A relationship between the timing of the heating process and the timing of the acoustic wave radiation process may be the same as a relationship between the timing of the heating process and the timing of the vibration process in the second embodiment. Further, a condition of the heating process may be the same as the condition in the second embodiment as well.

According to this embodiment, the metal paste layer 21 and the metal paste layer 22 are vibrated by acoustic waves from the speaker 56. With this configuration, voids in the metal paste layer 21 and the metal paste layer 22 are more easily removed. Consequently, the joining layer 41 and the joining layer 42 obtained from the metal paste layer 21 and the metal paste layer 22 can be more densified. Thus, quality of the joining layer 41 and the joining layer 42 can be enhanced. Specifically, strength of the joining layer 41 and the joining layer 42 per se can be enhanced. Further, joining strength between each of the joining layer 41 and the joining layer 42 and a member joined to each of the joining layer 41 and the joining layer 42 can be enhanced. Further, the thickness of the joining layer 41 and the joining layer 42 is reduced. With this configuration, thermal resistance of the joining layer 41 and the joining layer 42 is reduced. Consequently, heat dissipation performance of the power module 96 can be enhanced. Further, internal stress of the joining layer 41 and the joining layer 42 is made uniform, and therefore occurrence of cracks in the joining layers can be reduced.

(Modifications)

In the fifth embodiment, heating of the metal paste layer 21 and the metal paste layer 22 for forming the joining layer 41 and the joining layer 42 is performed at a temperature lower than a melting point. Instead of this configuration, similarly to the modification of the second embodiment, heating may be performed at a temperature equal to or higher than a melting point. In other words, a plurality of metal particles may be fused, instead of being sintered, and then be solidified. In such a case, the joining layer 41 and the joining layer 42 are made of a non-sintered material. Typically, the joining layer 41 and the joining layer 42 are made of solder. Particularly when the power semiconductor chip 70 includes a semiconductor layer made of a non-wide-bandgap semiconductor (typically Si), required levels of strength and heat conductivity of the joining layer 41 and the joining layer 42 are somewhat lower as compared to a case where the power semiconductor chip 70 includes a semiconductor layer made of a wide-bandgap semiconductor. Therefore, the use of the joining layer 41 and the joining layer 42 made of solder is allowed in many cases.

Further, the fifth embodiment describes a case where the power module 96 is manufactured by using a plurality of metal paste layers (metal paste layer 21 and metal paste layer 22). However, with a similar method, a power module may be manufactured by using one metal paste layer. With such a configuration, for example, a power module that is similar to the power module 81 (FIG. 2: first embodiment) but omitting the penetrating member 31 can be obtained.

Sixth Embodiment

Figure 24:
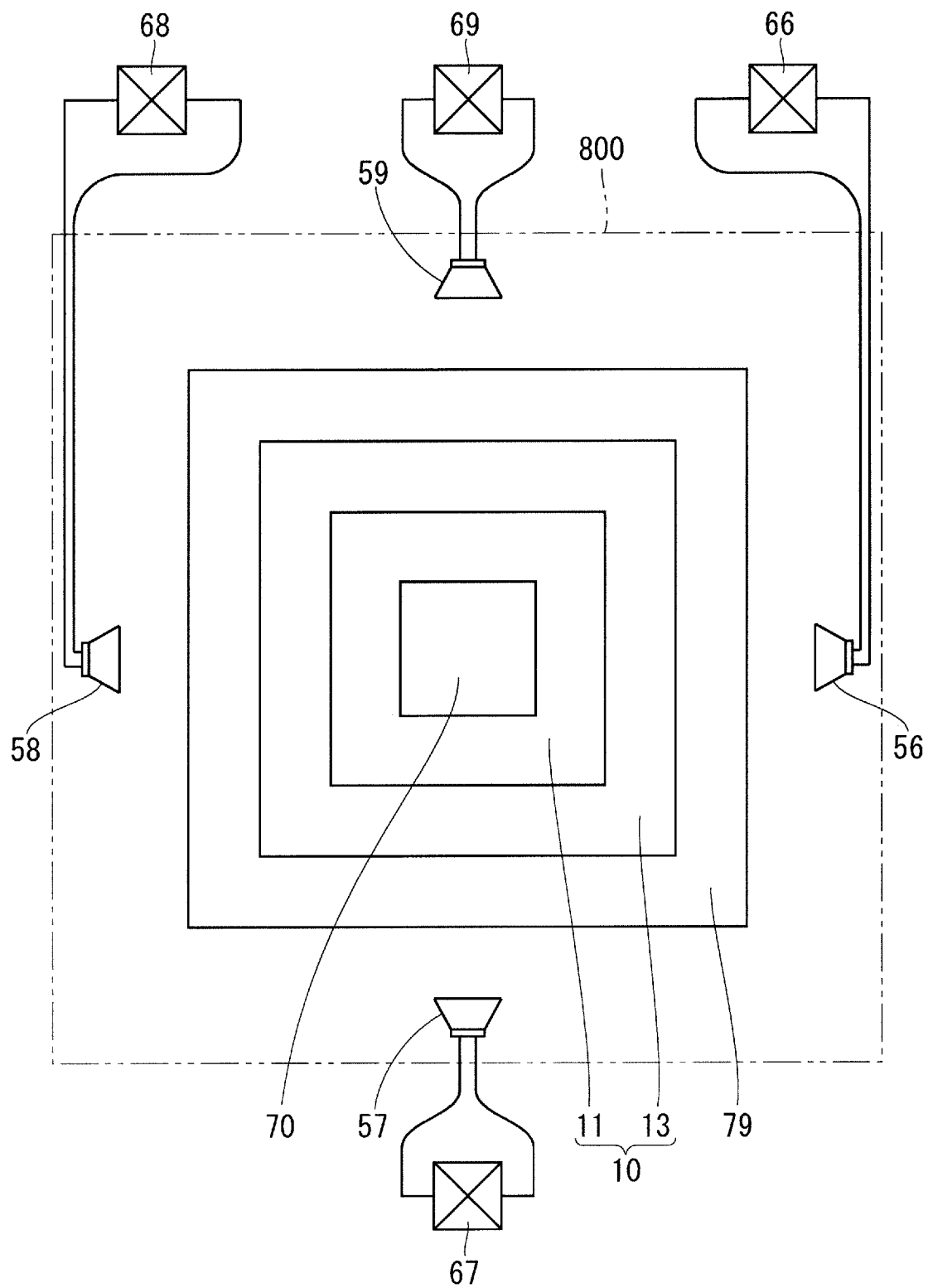
FIG. 24 is a plan view schematically illustrating one process of a manufacturing method of the power semiconductor device according to a sixth embodiment of the present invention.

In a sixth embodiment of the present invention, a manufacturing method of the power module 96 (FIG. 20 and FIG. 21) different from the manufacturing method in the fifth embodiment will be described. FIG. 24 is a plan view schematically illustrating one process of a manufacturing method of the power module 96 according to the sixth embodiment.

In this embodiment, in the acoustic wave radiation process, a plurality of speakers are used, instead of one speaker 56 (FIG. 22: fifth embodiment). Specifically, four speakers 56 to 59 are used, to which electric signals are applied respectively by signal generators 66 to 69. A center position of the metal paste layer 21 or the metal paste layer 22 in an in-plane direction is used as a reference. The speaker 56 is disposed in a first direction (right direction in FIG. 24), with respect to the center position. The speaker 57 is disposed in a second direction (lower direction in FIG. 24) different from the first direction, with respect to the center position. The speaker 58 is disposed in a third direction (left direction in FIG. 24) different from the first and second directions, with respect to the center position. The speaker 59 is disposed in a fourth direction (upper direction in FIG. 24) different from the first to third directions, with respect to the center position.

Only one of one speaker (first speaker) of the speakers 56 to 59 and another speaker (second speaker) of the speakers 56 to 59 generates acoustic waves at least temporarily in the acoustic wave radiation process. In this manner, a temporary stop of at least one speaker can further increase void removal efficiency, as compared to a case where all the speakers are started. For example, modes of acoustic wave radiation with at least one speaker being temporarily stopped may include acoustic wave radiation only from the speaker 56, acoustic wave radiation only from the speaker 57, acoustic wave radiation only from the speaker 58, acoustic wave radiation only from the speaker 59, acoustic wave radiation only from the speakers 56 and 57, and acoustic wave radiation only from the speakers 58 and 59. A void reduction effect can be increased to several times as large as a void reduction effect of the fifth embodiment, by appropriately combining these modes of acoustic wave radiation.

Seventh Embodiment

In this embodiment, the power module (power semiconductor device) according to the first to sixth embodiments described above is applied to a power converter. The semiconductor device according to the first to sixth embodiments is not limited to be applied to a specific power converter. As a seventh embodiment, the following describes a case where the power semiconductor device according to the first to sixth embodiments is applied to a three-phase inverter.

Figure 25:
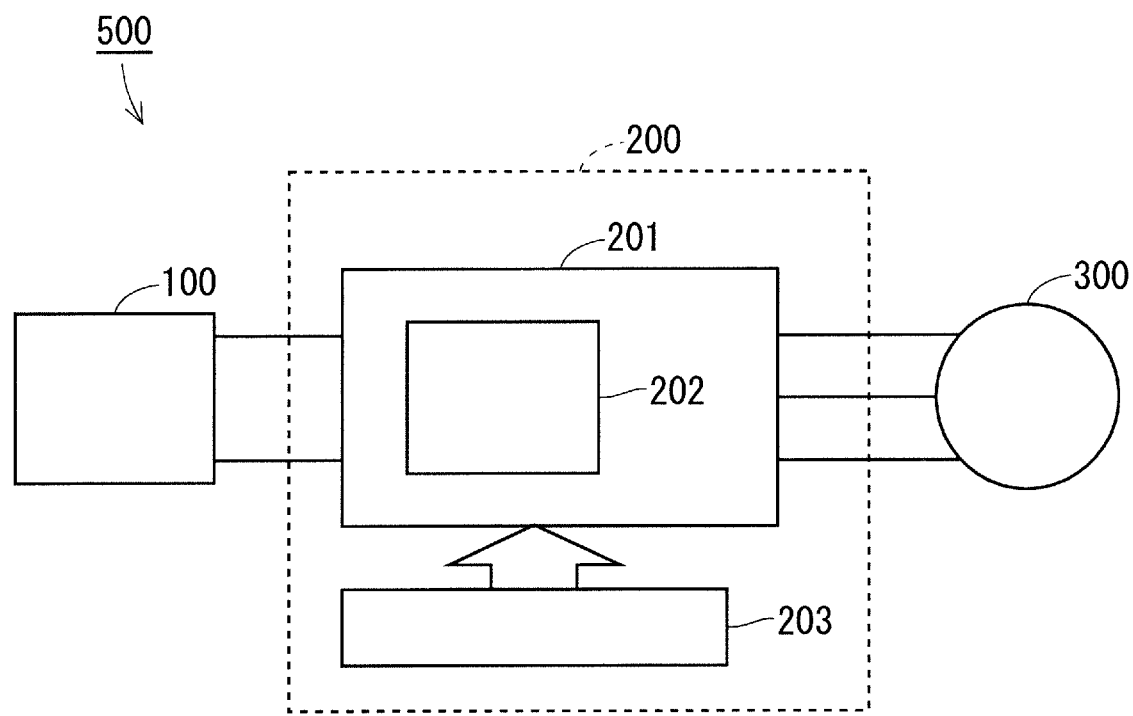
FIG. 25 is a block diagram schematically illustrating a configuration of a power conversion system to which a power converter is applied according to a seventh embodiment of the present invention.

FIG. 25 is a block diagram schematically illustrating a configuration of a power conversion system 500 to which a power converter 200 according to the seventh embodiment is applied. The power conversion system 500 includes a power supply 100, a power converter 200, and a load 300. The power converter 200 includes a main converter circuit 201 and a control circuit 203. The main converter circuit 201 converts incoming power, and outputs the converted incoming power. The main converter circuit 201 includes a power module 202 (power semiconductor device). The control circuit 203 outputs a control signal for control the main converter circuit 201 to the main converter circuit 201. The power supply 100 is a DC power supply, and supplies DC power to the power converter 200. The power supply 100 can consist of various elements. For example, the power supply 100 consists of a DC system, a solar battery, or a storage battery. Alternatively, the power supply 100 consists of a rectifier circuit connected to an AC system, or an AC/DC converter. Alternatively, the power supply 100 consists of a DC/DC converter that converts DC power output from a DC system into predetermined power.

The power converter 200 is a three-phase inverter connected between the power supply 100 and the load 300. The power converter 200 converts DC power supplied from the power supply 100 into AC power, and supplies the AC power to the load 300. As illustrated in FIG. 25, the power converter 200 includes a main converter circuit 201 that converts DC power to AC power and outputs the AC power, and a control circuit 203 that outputs a control signal for controlling the main converter circuit 201 to the main converter circuit 201.

The load 300 is a three-phase electric motor driven by AC power supplied from the power converter 200. Note that an electric motor as the load 300 is not limited to a specific usage, and can be mounted to various electrical devices. For example, the electric motor is an electric motor for a hybrid vehicle, an electric vehicle, a railway vehicle, an elevator, or an air conditioner.

The power converter 200 will be described below in detail. The main converter circuit 201 includes switching elements and freewheeling diodes (not shown). When the switching elements are switched, the main converter circuit 201 converts DC power supplied from the power supply 100 into AC power, and supplies the AC power to the load 300. Although there are various specific circuit configurations for the main converter circuit 201, the main converter circuit 201 according to this embodiment is a two-level three-phase full-bridge circuit, and can consist of six switching elements and six freewheeling diodes connected to respective switching elements in anti-parallel. At least any one of the switching elements and the freewheeling diodes of the main converter circuit 201 is formed by a power module 202 corresponding to any of the first to sixth embodiments described above. In six switching elements, each group consisting of two switching elements is connected in series, and forms upper and lower arms. The upper and lower arms form respective phases (U-phase, V-phase, and W-phase) of the full bridge circuit. Further, output terminals of the upper and lower arms, i.e., three output terminals of the main converter circuit 201, are connected to the load 300.

Further, the main converter circuit 201 includes a drive circuit (not shown) that drives each switching element. The drive circuit may be incorporated into the power module 202, or may be provided separately from the power module 202. The drive circuit generates a drive signal for driving the switching element of the main converter circuit 201, and supplies the drive signal to a control electrode of the switching element of the main converter circuit 201. Specifically, the drive circuit outputs a drive signal for turning on the switching element and a drive signal for turning off the switching element to the control electrode of each switching element, in accordance with a control signal from the control circuit 203 described later. When the switching element is maintained to be turned on, the drive signal is a voltage signal (on signal) equal to or higher than a threshold voltage of the switching element. When the switching element is maintained to be turned off, the drive signal is a voltage signal (off signal) lower than a threshold voltage of the switching element.

The control circuit 203 controls the switching element of the main converter circuit 201, such that desired power is supplied to the load 300. Specifically, based on power required to be supplied to the load 300, the control circuit 203 calculates time (on-time) at which each switching element of the main converter circuit 201 needs to be turned on. For example, the control circuit 203 controls the main converter circuit 201 by pulse width modulation (PWM) control. In the PWM control, the on-time for the switching element is modulated in accordance with a voltage required to be output. Then, the control circuit 203 outputs a control command (control signal) to the drive circuit of the main converter circuit 201, such that an on-signal is output to a switching element required to be turned on and an off-signal is output to a switching element required to be turned off, at their respective time points. In accordance with this control signal, the drive circuit outputs an on-signal or an off-signal to the control electrode of each switching element, as the drive signal.

In the power converter 200 according to this embodiment, the power module according to the first to sixth embodiments is used as at least any of the switching elements and the freewheeling diodes of the main converter circuit 201. Therefore, heat dissipation performance of the main converter circuit 201 can be enhanced. Consequently, deterioration of the main converter circuit 201 is reduced. Therefore, life of the power converter 200 can be enhanced.

This embodiment describes an example in which the power semiconductor device according to the first to sixth embodiments is applied to a two-level three-phase inverter. However, this is not restrictive, and the power semiconductor device according to the first to sixth embodiments can be applied to various power converters. This embodiment describes a two-level power converter. However, the power converter may be a three-level or a multi-level power converter. Further, when power is supplied to a single-phase load, the power semiconductor device according to the first to sixth embodiments can be applied to a single-phase inverter. Further, when power is supplied to a DC load, for example, the power semiconductor device according to the first to sixth embodiments can be applied to a DC/DC converter or an AC/DC converter.

Further, a load of a power converter to which the power semiconductor device according to the first to sixth embodiments is applied is not limited to an electric motor. For example, the power converter can be used as a power supply device for an electric discharge machine, a laser machine, an induction heating device, or a power supply system for a contactless device. Alternatively, the power converter can be used as a power conditioner for a photovoltaic power generation system or a power storage system, for example.

Note that, in the present invention, each of the embodiments may be freely combined, and each of the embodiments may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a power semiconductor device, comprising the steps of:
   stacking a power semiconductor element and a support member with an intermediate structure being interposed between the power semiconductor element and the support member, the intermediate structure comprising a first metal paste layer and at least one first penetrating member, the first metal paste layer containing a plurality of first metal particles, the at least one first penetrating member penetrating the first metal paste layer;
   vibrating at least one first vibrator attached to the at least one first penetrating member penetrating the first metal paste layer; and
   heating the first metal paste layer so that the plurality of first metal particles are sintered or fused.

2. The manufacturing method of a power semiconductor device according to claim 1, wherein
   the step of heating the first metal paste layer comprises the step of sintering the plurality of first metal particles at a temperature lower than a melting point of the plurality of first metal particles.

3. The manufacturing method of a power semiconductor device according to claim 1, wherein
   the step of vibrating the at least one first vibrator comprises the step of applying an electric signal to the at least one first vibrator by using a current path passing through the at least one first penetrating member.

4. The manufacturing method of a power semiconductor device according to claim 1, wherein
   in the step of vibrating the at least one first vibrator, the at least one first penetrating member comprises a first end portion and a second end portion that project from the first metal paste layer.

5. The manufacturing method of a power semiconductor device according to claim 4, wherein
   the at least one first vibrator comprises a first end-portion vibrator attached to the first end portion of the at least one first penetrating member, and a second end-portion vibrator attached to the second end portion of the at least one first penetrating member.

6. The manufacturing method of a power semiconductor device according to claim 5, wherein
   in the step of vibrating the at least one first vibrator, only one of the first end-portion vibrator and the second end-portion vibrator is vibrated at least temporarily.

7. The manufacturing method of a power semiconductor device according to claim 1, wherein
   the step of vibrating the at least one first vibrator is performed so that amplitude of the at least one first penetrating member is equal to or less than a thickness of the first metal paste layer.

8. The manufacturing method of a power semiconductor device according to claim 1, wherein
   the at least one first penetrating member is made of metal.

9. The manufacturing method of a power semiconductor device according to claim 1, wherein
   the step of stacking the power semiconductor element and the support member is performed so that each of one side and another side of the at least one first penetrating member in a stacking direction faces the first metal paste layer.

10. The manufacturing method of a power semiconductor device according to claim 1, wherein
    in the step of stacking the power semiconductor element and the support member, the at least one first penetrating member is disposed along a diagonal direction of the power semiconductor element.

11. The manufacturing method of a power semiconductor device according to claim 1, wherein
    the at least one first penetrating member comprises a plurality of penetrating members.

12. The manufacturing method of a power semiconductor device according to claim 1, wherein
    in the step of vibrating the at least one first vibrator, the at least one first penetrating member has a hollow shape.

13. The manufacturing method of a power semiconductor device according to claim 1, wherein
    the step of heating the first metal paste layer comprises the steps of:
      heating the first metal paste layer within a temperature range of a first temperature or below; and
      after the step of heating the first metal paste layer within the temperature range of the first temperature or below, heating the first metal paste layer up to a second temperature higher than the first temperature, and
    the step of vibrating the at least one first vibrator is stopped before the step of heating the first metal paste layer up to the second temperature higher than the first temperature.

14. The manufacturing method of a power semiconductor device according to claim 1, wherein
    the step of heating the first metal paste layer is performed without application of a pressure of pressing both the power semiconductor element and the support member from outside through the intermediate structure.

15. The manufacturing method of a power semiconductor device according to claim 1, wherein
    the step of stacking the power semiconductor element and the support member is performed so that the intermediate structure comprises:
      a circuit substrate stacked below the power semiconductor element with the first metal paste layer being interposed between the circuit substrate and the power semiconductor element;
      a second metal paste layer being disposed between a heat dissipation member as the support member and the circuit substrate, and containing a plurality of second metal particles; and
      at least one second penetrating member penetrating the second metal paste layer, and
    the manufacturing method of the power semiconductor device further comprises the steps of:
      vibrating at least one second vibrator attached to the at least one second penetrating member penetrating the second metal paste layer; and
      heating the second metal paste layer so that the plurality of second metal particles are sintered or fused.

16. The manufacturing method of a power semiconductor device according to claim 15, wherein
    a period of time in which the step of vibrating the at least one first vibrator is performed and a period of time in which the step of vibrating the at least one second vibrator is performed are at least partially different from each other.

17. A manufacturing method of a power semiconductor device, comprising the steps of:
    stacking a power semiconductor element and a support member with an intermediate structure being interposed between the power semiconductor element and the support member, the intermediate structure comprising a metal paste layer containing a plurality of metal particles;

emitting acoustic waves from at least one speaker to the metal paste layer; and heating the metal paste layer so that the plurality of metal particles are sintered or fused.

18. The manufacturing method of a power semiconductor device according to claim 17, wherein in the step of emitting acoustic waves from the at least one speaker, the at least one speaker comprises a first speaker and a second speaker, a center position of the metal paste layer in an in-plane direction is used as a reference, the first speaker is disposed in a first direction with respect to the center position, the second speaker is disposed in a second direction different from the first direction with respect to the center position, and only one of the first speaker and the second speaker generates acoustic waves at least temporarily.

* * * * *